United States Patent
Chepulskyy et al.

(10) Patent No.: US 9,130,155 B2
(45) Date of Patent: Sep. 8, 2015

(54) MAGNETIC JUNCTIONS HAVING INSERTION LAYERS AND MAGNETIC MEMORIES USING THE MAGNETIC JUNCTIONS

(71) Applicant: Samsung Electronics Co., LTD., Gyeonggi-do (KR)

(72) Inventors: Roman Chepulskyy, Milpitas, CA (US); Xueti Tang, San Jose, CA (US); Dmytro Apalkov, San Jose, CA (US); Alexey Vasilyevitch Khvalkovskiy, Milpitas, CA (US); Vladimir Nikitin, Campbell, CA (US); Mohamad Towfik Krounbi, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/048,329

(22) Filed: Oct. 8, 2013

(65) Prior Publication Data
US 2014/0264671 A1  Sep. 18, 2014

Related U.S. Application Data

(60) Provisional application No. 61/793,743, filed on Mar. 15, 2013.

(51) Int. Cl.
| | |
|---|---|
| *H01L 43/08* | (2006.01) |
| *G11C 11/16* | (2006.01) |
| *H01L 43/10* | (2006.01) |
| *H01L 43/12* | (2006.01) |

(52) U.S. Cl.
CPC ............... *H01L 43/10* (2013.01); *G11C 11/16* (2013.01); *H01L 43/08* (2013.01); *H01L 43/12* (2013.01)

(58) Field of Classification Search
CPC ......... H01L 43/02; H01L 43/04; H01L 43/10; H01L 43/08; H01L 43/12; G11C 11/14–11/16; G11C 11/161
USPC ......................................................... 365/158
See application file for complete search history.

(56) References Cited

U.S. PATENT DOCUMENTS

| | | | |
|---|---|---|---|
| 6,784,509 B2* | 8/2004 | Yuasa et al. | .................... 257/421 |
| 6,985,385 B2 | 1/2006 | Nguyen | |
| 7,067,331 B2 | 6/2006 | Slaughter | |
| 7,105,372 B2 | 9/2006 | Min | |
| 7,576,956 B2 | 8/2009 | Huai | |
| 7,602,033 B2 | 10/2009 | Zhao | |
| 7,973,349 B2 | 7/2011 | Huai | |
| 8,058,697 B2 | 11/2011 | Guo | |
| 8,710,602 B2* | 4/2014 | Tang et al. | .................... 257/421 |

(Continued)

*Primary Examiner* — Allison P Bernstein
(74) *Attorney, Agent, or Firm* — Convergent Law Group LLP

(57) ABSTRACT

A method and system for providing a magnetic junction usable in a magnetic device are described. The magnetic junction includes a reference layer, a nonmagnetic spacer layer and a free layer. The nonmagnetic spacer layer is between the reference layer and the free layer. The magnetic junction is configured such that the free layer is switchable between a plurality of stable magnetic states when a write current is passed through the magnetic junction. A portion of the magnetic junction includes at least one magnetic substructure. The magnetic substructure includes at least one Fe layer and at least one nonmagnetic insertion layer. The at least one Fe layer shares at least one interface with the at least one nonmagnetic insertion layer. Each of the at least one nonmagnetic insertion layer consists of at least one of W, I, Hf, Bi, Zn, Mo, Ag, Cd, Os and In.

31 Claims, 14 Drawing Sheets

(56) References Cited

U.S. PATENT DOCUMENTS

| | | | |
|---|---|---|---|
| 8,890,267 B2* | 11/2014 | Apalkov et al. | 257/421 |
| 2011/0102948 A1* | 5/2011 | Apalkov et al. | 360/324.2 |
| 2011/0149647 A1* | 6/2011 | Kim et al. | 365/171 |
| 2012/0002463 A1 | 1/2012 | Ranjan | |
| 2012/0039115 A1* | 2/2012 | Zheng et al. | 365/158 |
| 2012/0112297 A1* | 5/2012 | Yamakawa et al. | 257/421 |
| 2014/0001524 A1* | 1/2014 | Manipatruni et al. | 257/295 |
| 2014/0247653 A1* | 9/2014 | Wang et al. | 365/158 |
| 2014/0252439 A1* | 9/2014 | Guo | 257/295 |
| 2015/0041934 A1* | 2/2015 | Khvalkovskiy et al. | 257/421 |

\* cited by examiner

MAGNETIC JUNCTIONS HAVING INSERTION LAYERS AND MAGNETIC MEMORIES USING THE MAGNETIC JUNCTIONS

CROSS-REFERENCE TO RELATED APPLICATIONS

This application claims the benefit of provisional Patent Application Ser. No. 61/793,743, filed Mar. 5, 2013, entitled MAGNETIC JUNCTIONS HAVING INSERTION LAYERS AND MAGNETIC MEMORIES USING THE MAGNETIC JUNCTIONS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetic moment 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetic moment 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetic moment 21 of the conventional free layer 20 may have a perpendicular anisotropy. Thus, the pinned layer 16 and free layer 20 may have their magnetic moments 17 and 21, respectively oriented perpendicular to the plane of the layers.

To switch the magnetic moment 21 of the conventional free layer 20, a current is driven perpendicular to plane (in the z-direction). When a sufficient current is driven from the top contact 24 to the bottom contact 11, the magnetic moment 21 of the conventional free layer 20 may switch to be parallel to the magnetic moment 17 of the conventional pinned layer 16. When a sufficient current is driven from the bottom contact 11 to the top contact 24, the magnetic moment 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

When used in STT-RAM applications, the free layer magnetic moment 21 of the conventional MTJ 10 is desired to be switched at a relatively low current. The critical switching current ($I_{c0}$) is the lowest current at which the infinitesimal precession of free layer magnetic moment 21 around the equilibrium orientation becomes unstable. For example, $I_{c0}$ may be desired to be on the order of a few mA or less. In addition, a short current pulse is desired to be used in programming the conventional magnetic element 10 at higher data rates.

Although the conventional MTJ 10 may be written using spin transfer and used in an STT-RAM, there are drawbacks. The conventional magnetic junction 10 has its magnetic moments 17 and 21 in plane. In order to improve switching characteristics, it may be desirable for the magnetic moments 17 and 21 to be perpendicular to plane (i.e. in the z direction). However, for such an orientation, the signal from the conventional MTJ 10 may be lower than desired. Such perpendicular conventional MTJs 10 typically also exhibit high damping. As such, switching performance is adversely affected. Thus, performance of a memory using the conventional MTJ 10 is still desired to be improved.

Accordingly, what is needed is a method and system that may improve the performance of the spin transfer torque based memories. The method and system described herein address such a need.

BRIEF SUMMARY OF THE INVENTION

A method and system for providing a magnetic junction usable in a magnetic device are described. The magnetic junction includes a reference layer, a nonmagnetic spacer layer and a free layer. The nonmagnetic spacer layer is between the reference layer and the free layer. The magnetic junction is configured such that the free layer is switchable between a plurality of stable magnetic states when a write current is passed through the magnetic junction. A portion of the magnetic junction includes at least one magnetic substructure. The magnetic substructure includes at least one Fe layer and at least one nonmagnetic insertion layer. The at least one Fe layer shares at least one interface with the at least one nonmagnetic insertion layer. Each of the at least one nonmagnetic insertion layer consists of at least one of W, I, Hf, Bi, Zn, Mo, Ag, Cd, Os and In.

DETAILED DESCRIPTION OF THE INVENTION

Figure 1:
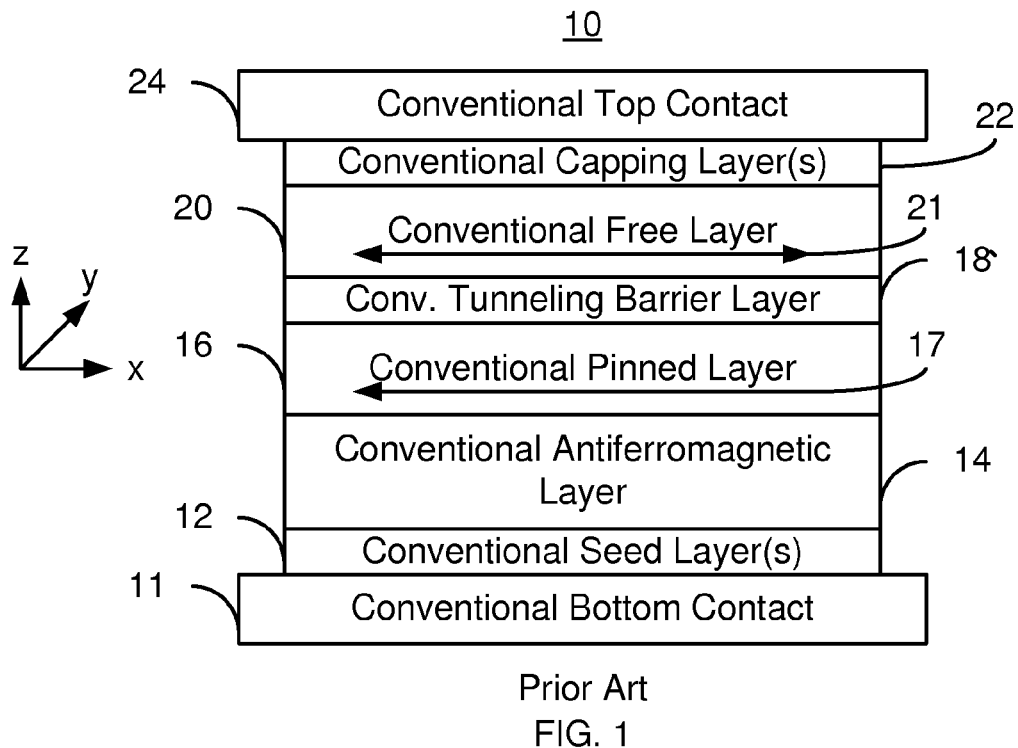
FIG. 1 depicts a conventional magnetic junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. Exemplary embodiments that provide a magnetic junction usable in a magnetic device are described. The magnetic junction includes a reference layer, a nonmagnetic spacer layer and a free layer. The nonmagnetic spacer layer is between the reference layer and the free layer. The magnetic junction is configured such that the free layer is switchable between a plurality of stable magnetic states when a write current is passed through the magnetic junction. A portion of the magnetic junction includes at least one magnetic substructure. The magnetic substructure includes at least one Fe layer and at least one nonmagnetic insertion layer. The at least one Fe layer shares at least one interface with the at least one nonmagnetic insertion layer. Each of the at least one nonmagnetic insertion layer consists of at least one of W, I, Hf, Bi, Zn, Mo, Ag, Cd, Os and In.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
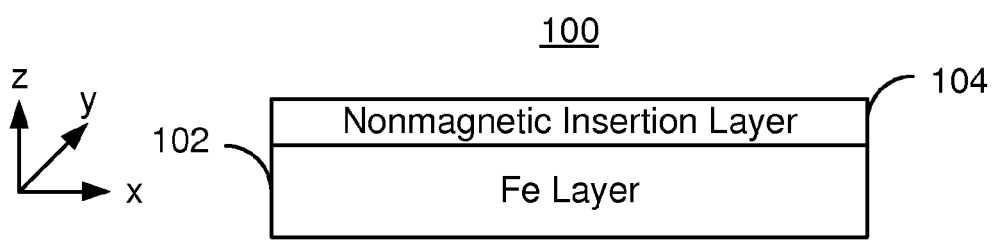
FIG. 2 depicts an exemplary embodiment of a magnetic substructure.

FIG. 2 depicts an exemplary embodiment of a magnetic substructure 100 usable in a magnetic device, for example a magnetic tunneling junction (MTJ), spin valve, or ballistic magnetoresistance structure, or some combination thereof. The magnetic device in which the magnetic substructure 100 is used may be used in a variety of applications. For example, the magnetic device, and thus the magnetic substructure, may be used in a magnetic memory such as an STT-RAM. For clarity, FIG. 2 is not to scale. The magnetic substructure 100 includes a Fe layer 102 and a nonmagnetic insertion layer 104. The layers 102 and 104 share an interface 103. Thus, the nonmagnetic insertion layer 104 adjoins the Fe layer 102. In the embodiment shown in FIG. 2, the Fe layer 102 may be deposited first on an underlying substrate (not shown). Although layers 102 and 104 are shown with a particular orientation, this orientation may vary in other embodiments.

The layer 102 is ferromagnetic, while the layer 104 is nonmagnetic. More specifically, the magnetic layer 102 is Fe, while the nonmagnetic insertion layer 104 includes one or more of W, I, Hf, Bi, Zn, Mo, Ag, Cd, Os and In. in the magnetic substructure 100 shown, the Fe layer 102 has a high perpendicular magnetic anisotropy. Stated differently, the perpendicular anisotropy energy of the Fe layer 102 may be greater than the out-of-plane demagnetization energy, $4\pi M_s$. In such embodiments, the magnetic moment of the Fe layer 102 is perpendicular to plane (along the z-axis). In other embodiments, the perpendicular magnetic anisotropy of the Fe layer 102 may be in the middle ranges. In such embodiments, the perpendicular magnetic anisotropy energy may be close to but less than the out of plane demagnetization energy. For example, the perpendicular anisotropy energy may be at least forty percent but less than one hundred percent of the out-of-plane demagnetization energy. In some such embodiments, the perpendicular anisotropy energy may be not more than ninety percent of the demagnetization energy. It is believed that the high perpendicular anisotropy of the Fe layer 102 may be due to electron hybridization at the interface 103. Thus, it is believed that the high perpendicular anisotropy is due to an interfacial phenomenon. However, the magnetic junctions, magnetic memory, and methods described herein are not dependent upon a particular physical phenomenon. For example, in some embodiments, other characteristics, including but not limited to strain in the layers 102 and/or 104 may contribute to the magnetic anisotropy of the layer 102. Further, because it consists of Fe, the Fe layer 102 may have low magnetic damping.

The crystal structure of the Fe layer 102, as well as the nonmagnetic insertion layer 104, may be BCC. The layers 102 and 104 may also have a mismatch of lattice parameters of not more than five percent. This is due to the selection of Fe for the layer 102 and one or more of W, I, Hf, Bi, Zn, Mo, Ag, Cd, Os and In for the nonmagnetic insertion layer 104. In some embodiments, the nonmagnetic insertion layer 104 may be desired to consist of one of the materials W, I, Hf, Bi, Zn, Mo, Ag, Cd, Os or In. In some such embodiments, the insertion layer 104 may consist of W.

In some embodiments, the ferromagnetic layer 102 is configured to be stable at room temperature. For example, the magnetic anisotropy energy for the ferromagnetic layers 102 may be at least at least sixty times $k_b T$. In some embodiments, the magnetic anisotropy energies for the ferromagnetic layers 102 is at least eighty times $k_b T$ at room temperature (approximately thirty degrees centigrade). However, in other embodiments, thermal stability of the layer 102 may be achieved by magnetically coupling the layer 102 with another magnetic layer (not shown in FIG. 2).

The thicknesses of the Fe layer 102 and/or the nonmagnetic insertion layer 104 may be tailored to provide the desired perpendicular magnetic anisotropy, thermal stability, coupling between the layers 102 and 104 and/or other features. In some embodiments, the Fe layer 102 is at least one Angstrom thick and not more than fourteen Angstroms thick. In some such embodiments, the thickness of the Fe layer 102 is at least four and not more than ten Angstroms. The nonmagnetic insertion layer 104 may be at least one Angstrom and not more than eight Angstroms. In some such embodiments, the nonmagnetic insertion layer 104 is at least two Angstroms and not more than six Angstroms thick. Thus, although shown as full films, the layers 102 and/or 104 may actually be discontinuous. For example, the nonmagnetic insertion layer 104 may exists as islands on the Fe layer 102 at lower thicknesses.

The properties of the magnetic substructure 100 may be tailored using a combination of the nonmagnetic insertion layer 104 and the Fe layer 102. As a result, the properties of a magnetic device in which the magnetic substructure 100 is used may also be configured as desired. For example, the TMR of the magnetic device in which the magnetic substructure 100 is used may be enhanced due to improved crystallization of the free layer and lattice match with the tunneling junction. The perpendicular anisotropy and damping of layers such as the free and/or pinned layers may also be engineered. Further, in some embodiments, the magnetic substructure 100 may be used to provide a free layer having a magnetic moment that is stable at an angle from perpendicular to plane. Thus, the switching characteristics of the magnetic device may be enhanced. The magnetic substructure 100 may also be used to provide a spin-orbit coupling with magnetic layer(s) in the magnetic device. Thus, other mechanisms for switching that can be used in conjunction with or in lieu of spin transfer torque may be provided.

Figure 3:
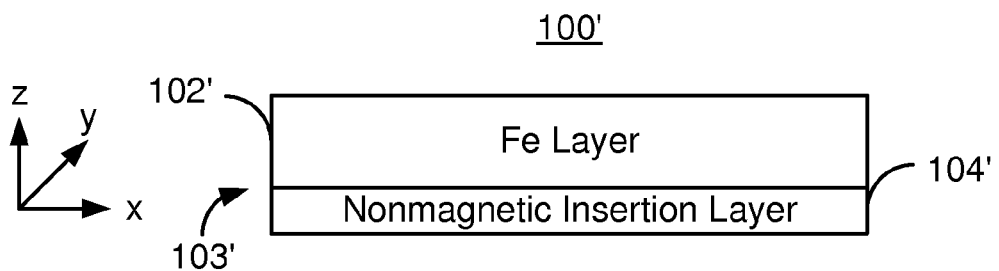
FIG. 3 depicts an exemplary embodiment of a magnetic substructure.

FIG. 3 depicts an exemplary embodiment of a magnetic substructure 100' usable in a magnetic device, for example a MTJ, spin valve, or ballistic magnetoresistance structure, or some combination thereof. The magnetic device in which the magnetic substructure 100' is used may be used in a variety of applications. For example, the magnetic device, and thus the magnetic substructure, may be used in a magnetic memory such as an STT-RAM. For clarity, FIG. 3 is not to scale. The magnetic substructure 100' is analogous to the magnetic substructure 100. Consequently, analogous components are labeled similarly. The magnetic substructure 100' thus includes a first Fe layer 102', a nonmagnetic insertion layer 104' that share an interface 103'. However, the orientation of the layers 102' and 104' with any underlying layers has been changed. Thus, the Fe layer 102' is provided on the nonmagnetic insertion layer 104'. The benefits of the magnetic substructure 100' are analogous to those of the magnetic substructure 100.

Figure 4:
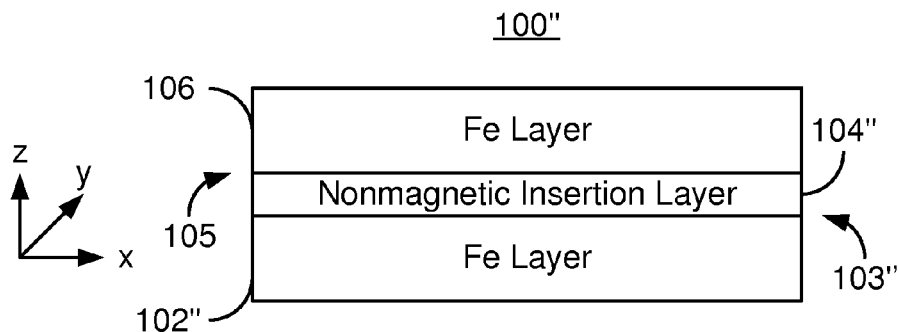
FIG. 4 depicts another exemplary embodiment of a magnetic substructure.

FIG. 4 depicts an exemplary embodiment of a magnetic substructure 100" usable in a magnetic device, for example a MTJ, spin valve, or ballistic magnetoresistance structure, or some combination thereof. The magnetic device in which the magnetic substructure 100" is used may be used in a variety of applications. For example, the magnetic device, and thus the magnetic substructure, may be used in a magnetic memory such as an STT-RAM. For clarity, FIG. 4 is not to scale. The magnetic substructure 100" is analogous to the magnetic substructure 100 and 100'. Consequently, analogous components are labeled similarly. The magnetic substructure 100" thus includes a first Fe layer 102", a nonmagnetic insertion layer 104" and a second Fe layer 106. Interface 103" is between the layers 102" and 104", while interface 105 is between layers 104" and 106.

The Fe layer 106 is analogous to the Fe layer 102". In some embodiments, the Fe layer 106 has the same thickness and other properties as the Fe layer 102". Further, the Fe layer 106 may have the high perpendicular analogous to that of the Fe layer 102. The nonmagnetic insertion layer 104" is also desired to be sufficiently thin that the Fe layers 102" and 106 are ferromagnetically coupled. Thus, as discussed above, the nonmagnetic insertion layer is at least one and not more than eight Angstroms thick. In some embodiments, the nonmagnetic insertion layer 104" is at least two and not more than six Angstroms thick. Further, as the high perpendicular anisotropy is believed to be at least partially based on the presence of interfaces 103" and 105, the magnetic substructure 100" is believed to have a higher perpendicular magnetic anisotropy than the magnetic substructure 100. Thus, the magnetic substructure 100" may share the benefits of the magnetic substructures 100 and 100'.

Figure 5:
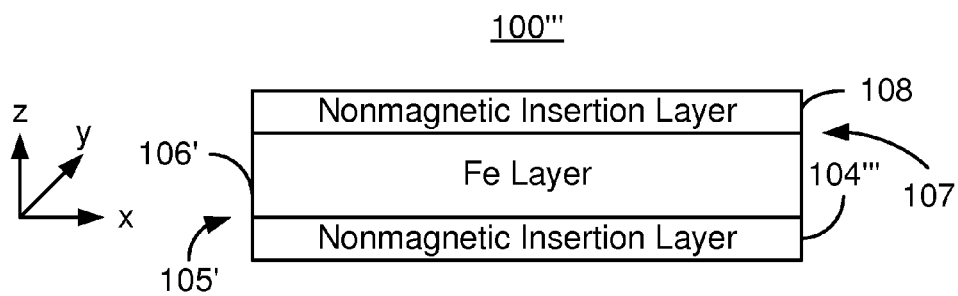
FIG. 5 depicts another exemplary embodiment of a magnetic substructure.

FIG. 5 depicts an exemplary embodiment of a magnetic substructure 100''' usable in a magnetic device, for example a MTJ, spin valve, or ballistic magnetoresistance structure, or some combination thereof. The magnetic device in which the magnetic substructure 100''' is used may be used in a variety of applications. For example, the magnetic device, and thus the magnetic substructure, may be used in a magnetic memory such as an STT-RAM. For clarity, FIG. 5 is not to scale. The magnetic substructure 100''' is analogous to the magnetic substructures 100, 100' and 100". Consequently, analogous components are labeled similarly. The magnetic substructure 100''' thus includes a first nonmagnetic insertion layer 104''', a Fe layer 106 and a second nonmagnetic insertion layer 108. Interface 105' is between the layers 104''' and 1046', while interface 107 is between layers 106" and 108.

The nonmagnetic insertion layer 108 is analogous to the nonmagnetic insertion layer 104'''. In some embodiments, the nonmagnetic insertion layer 108 has the same thickness and other properties as the nonmagnetic insertion layer 104'''. Further, as the high perpendicular anisotropy is believed to be at least partially based on the presence of interfaces 105' and 107, the magnetic substructure 100" is believed to have an enhanced perpendicular magnetic anisotropy. Thus, the magnetic substructure 100''' may share the benefits of the magnetic substructures 100, 100' and 100".

Figure 6:
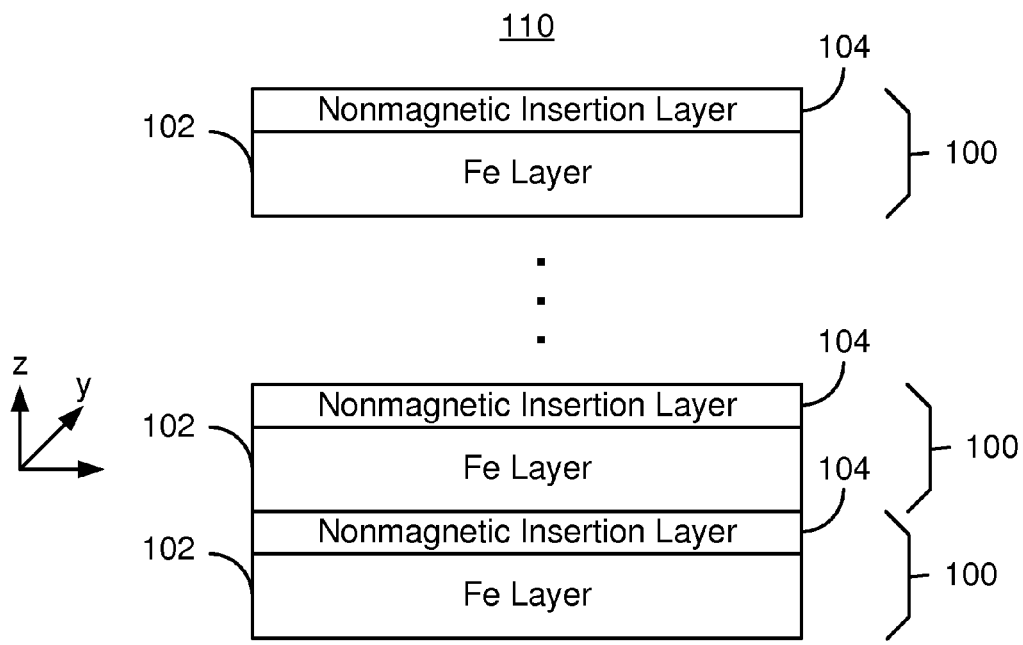
FIG. 6 depicts another exemplary embodiment of a magnetic substructure.
Figure 7:
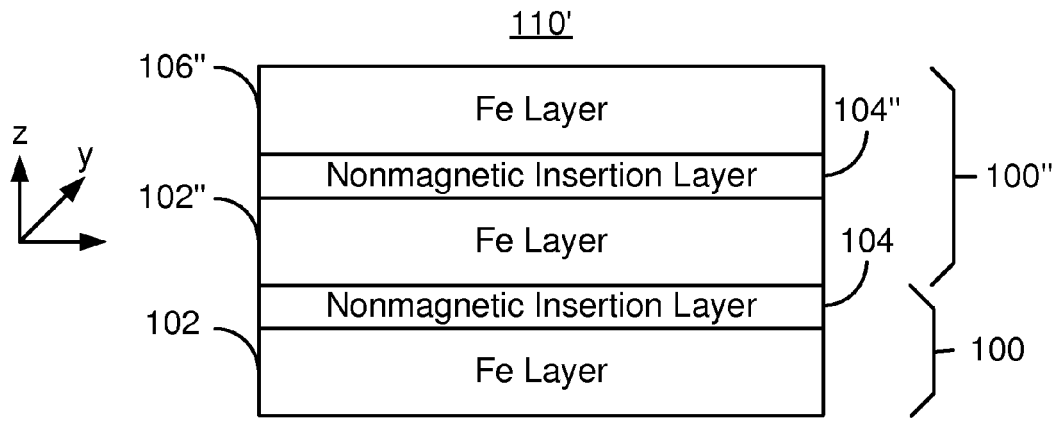
FIG. 7 depicts another exemplary embodiment of a magnetic substructure.

The magnetic substructures 100, 100', 100", and/or 100''' may be combined. Such combination may have additional interfaces and, therefore, enhanced magnetic properties. Multiple iterations of a particular one of the substructures 100, 100', 100" or 100''' may be used. Alternatively iteration(s) of different magnetic substructures 100, 100', 100" and 100''' may be mixed and matched. By utilizing combinations of one or more iterations the substructure(s) 100, 100', 100", and/or 100''', the properties of magnetic layers in a magnetic memory may be tailored. For example, the perpendicular magnetic anisotropy may be increased by combining multiple magnetic substructures 100, 100', 100", and/or 100'''. FIG. 6 depicts an exemplary embodiment of one such magnetic structure 110. The magnetic structure 110 is formed by combining three or more of the same magnetic substructures 100. The possibility of additional repeats of the substructure 100 is indicated by vertical dots. Similarly, FIG. 7 depicts a magnetic structure 110' that is formed by combining magnetic substructures 100 and 100". The properties of the magnetic structures 110 and/or 110' and other analogous magnetic structures may be tailored by through various combinations of the magnetic substructures 100, 100', 100" and/or 100''' as well as other magnetic and/or nonmagnetic layers. Thus, using the magnetic substructures 100, 100', 100" and/or 100''' the desired characteristics of the magnetic structures may be achieved. For example, the desired magnetic anisotropy, orientation of magnetic moments (in-plane, weakly in plane, perpendicular to plane or easy-cone) may be achieved. Thus, magnetic junctions using such substructures and magnetic memories using such magnetic junctions may be improved.

Figure 8:
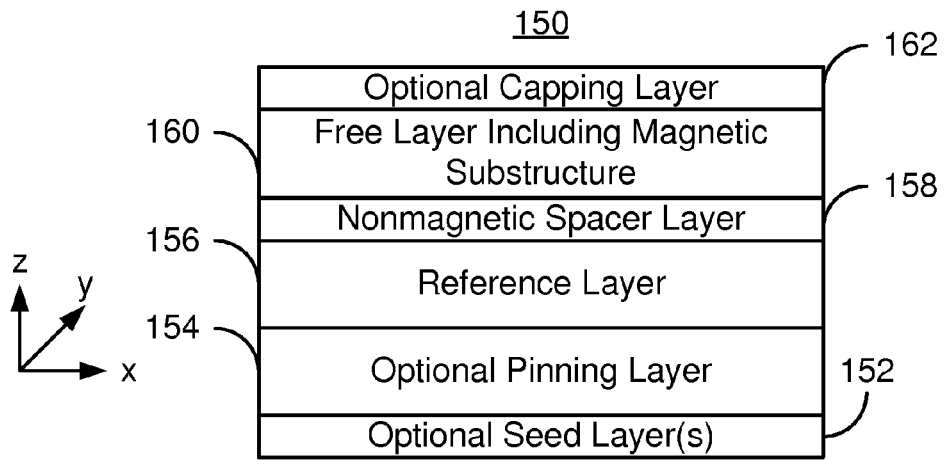
FIG. 8 depicts an exemplary embodiment of a magnetic junction including magnetic substructure.

For example, FIG. 8 depicts one embodiment of a magnetic junction 150 that may incorporate the magnetic substructure(s) 100, 100', 100", and/or 100'''. For clarity, FIG. 8 is not to scale. The magnetic junction 150 includes an optional seed layer 152, an optional pinning layer 154, reference layer 156, a nonmagnetic spacer layer 158, free layer 160 and optional capping layer 162. Although layers 156, 158 and 160 are shown with a particular orientation, this orientation may vary in other embodiments. For example, the reference layer 156 may be closer to the top (furthest from a substrate that is not shown) of the magnetic junction 150. The optional pinning layer 154 may be used to fix the magnetization (not shown) of the pinned layer 156. In some embodiments, the optional pinning layer 154 may be an AFM layer or multilayer that pins the magnetization (not shown) of the pinned layer 150 by an exchange-bias interaction. However, in other embodiments, the optional pinning layer 154 may be omitted or another structure may be used. The magnetic junction 150 is also configured to allow the free layer 160 to be switched between stable magnetic states when a write current is passed through the magnetic junction 150. Thus, the free layer 160 is switchable utilizing spin transfer torque.

Although depicted as a simple layer, the reference layer 154 may include multiple layers. For example, the reference layer 154 may be a SAF including magnetic layers antiferromagnetically or ferromagnetically coupled through thin layers, such as Ru. In such a SAF, multiple magnetic layers interleaved with thin layer(s) of Ru or other material may be used. The reference layer 154 may also be another multilayer. Although a magnetization is not depicted in FIG. 8, the reference layer 154 may have a perpendicular anisotropy energy that exceeds the out-of-plane demagnetization energy. Thus, the reference layer 154 may have its magnetic moment oriented perpendicular to plane. In other embodiments, the magnetic moment of the reference layer 154 is in-plane. Other orientations of the magnetization of the pinned layer 210 are possible.

The spacer layer 156 is nonmagnetic. In some embodiments, the spacer layer 156 is an insulator, for example a tunneling barrier. In such embodiments, the spacer layer 220 may include crystalline MgO, which may enhance the TMR of the magnetic junction. In other embodiments, the spacer layer may be a conductor, such as Cu. In alternate embodiments, the spacer layer 156 might have another structure, for example a granular layer including conductive channels in an insulating matrix.

The free layer 160 includes the magnetic substructure 100, 100', 100", and/or 100'''. In some embodiments, the free layer 160 is composed of the magnetic substructure 100, 100', 100", and/or 100'''. Further, the free layer 160 may include combinations of the magnetic substructures 100, 100', 100", and/or 100'''. Further other layers, such as polarization enhancement layers, may also be provided. For example, the free layer 160 may include one or more CoFeB or FeB polarization enhancement layer.

Because the magnetic substructure 100, 100', 100", and/or 100''' is used in the free layer 160, the magnetic junction 150 may share the benefits of the magnetic substructure 100, 100', 100", and/or 100'''. In particular, the magnetic junction 150 may be thermally stable, have the desired magnetic moment, have improved lattice matching with an MgO barrier layer used as the nonmagnetic spacer layer 158, and have the desired magnetic anisotropy and/or lower magnetic damping. Thus, performance of the magnetic junction 150 may be improved.

Figure 9:
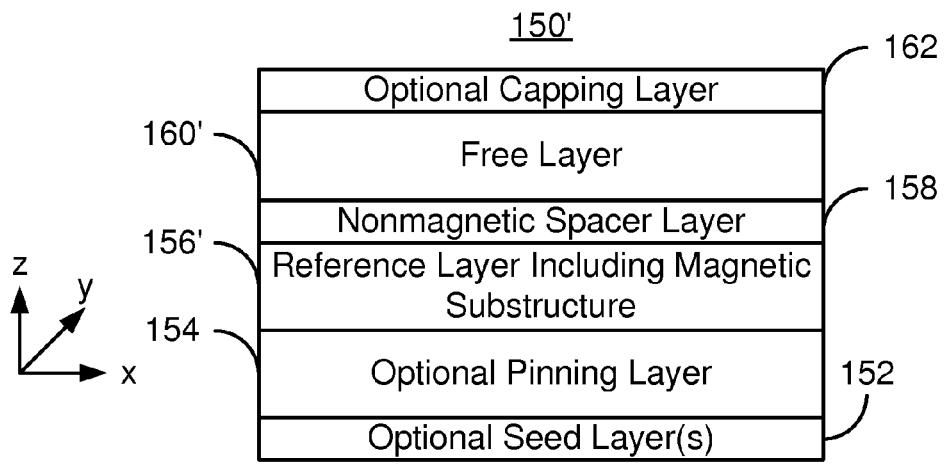
FIG. 9 depicts another exemplary embodiment of a magnetic junction including magnetic substructure.

FIG. 9 depicts an exemplary embodiment of a magnetic junction 150' that may incorporate the magnetic substructure(s) 100, 100', 100", and/or 100'''. For clarity, FIG. 9 is not to scale. The magnetic junction 150 includes an optional seed layer 152, an optional pinning layer 154, reference layer 156', a nonmagnetic spacer layer 158, free layer 160' and optional capping layer 162. Although layers 156', 158 and 160' are shown with a particular orientation, this orientation may vary in other embodiments. For example, the reference layer 156' may be closer to the top (furthest from a substrate that is not shown) of the magnetic junction 150. The optional pinning layer 154 may be used to fix the magnetization (not shown) of the pinned layer 156'. In some embodiments, the optional pinning layer 154 may be an AFM layer or multilayer that pins the magnetization (not shown) of the pinned layer 150 by an exchange-bias interaction. However, in other embodiments, the optional pinning layer 154 may be omitted or another structure may be used. The magnetic junction 150 is also configured to allow the free layer 160' to be switched between stable magnetic states when a write current is passed through the magnetic junction 150. Thus, the free layer 160' is switchable utilizing spin transfer torque.

Although depicted as a simple layer, the free layer 160' may include multiple layers. For example, the free layer 160' may be a SAF including magnetic layers antiferromagnetically or ferromagnetically coupled through thin layers, such as Ru. In such a SAF, multiple magnetic layers interleaved with thin layer(s) of Ru or other material may be used. The free layer 160' may also be another multilayer. The spacer layer 156 is nonmagnetic and analogous to the spacer layer 156 of FIG. 8.

The reference layer 156' includes the magnetic substructure 100, 100', 100", and/or 100'''. In some embodiments, the reference layer 156' is composed of the magnetic substructure 100, 100', 100", and/or 100'''. Further, the reference layer 156' may include combinations of the magnetic substructures 100, 100', 100", and/or 100'''. Further other layers, such as polarization enhancement layers, may also be provided. For example, the reference layer 156' may include one or more CoFeB or FeB polarization enhancement layer.

Because the magnetic substructure 100, 100', 100", and/or 100''' is used in the reference layer 156', the magnetic junction 150' may share the benefits of the magnetic substructure 100, 100', 100", and/or 100'''. In particular, the magnetic junction 150' may be thermally stable, have the desired magnetic moment, have improved lattice matching with an MgO barrier layer used as the nonmagnetic spacer layer 158, have the desired magnetic anisotropy and/or have lower magnetic damping. Thus, performance of the magnetic junction 150' may be improved.

Figure 10:
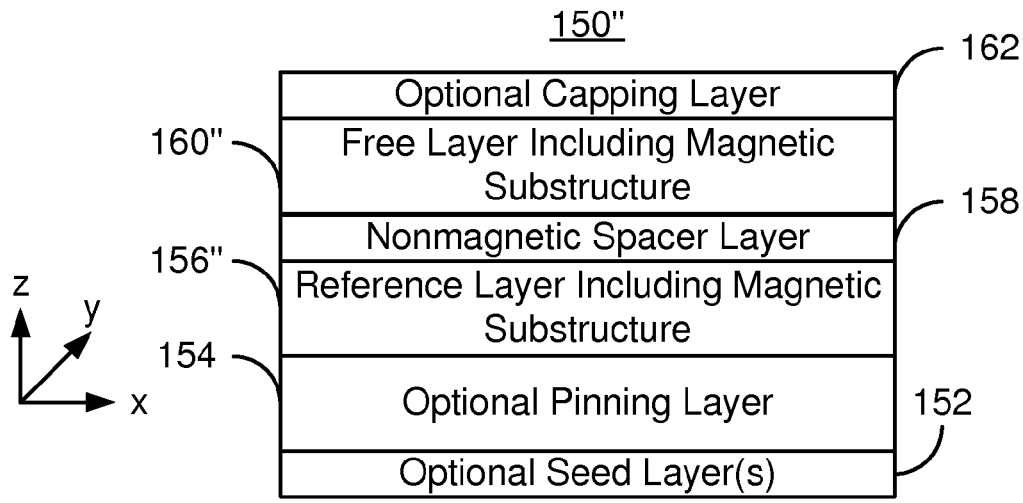
FIG. 10 depicts another exemplary embodiment of a magnetic junction including a magnetic substructure.

FIG. 10 depicts an exemplary embodiment of a magnetic junction 150" that may incorporate the magnetic substructure(s) 100, 100', 100", and/or 100'''. For clarity, FIG. 10 is not to scale. The magnetic junction 150' includes an optional seed layer 152, an optional pinning layer 154, reference layer 156", a nonmagnetic spacer layer 158, free layer 160" and optional capping layer 162. Although layers 156", 158 and 160" are shown with a particular orientation, this orientation may vary in other embodiments. For example, the reference layer 156" may be closer to the top (furthest from a substrate that is not shown) of the magnetic junction 150. The optional seed layer 152, the optional pinning layer 154 and the optional capping layer 162 are analogous to those described above.

Both the reference layer 156" and the free layer 160" includes the magnetic substructure 100, 100', 100", and/or 100'''. In some embodiments, the reference layer 156" and/or the free layer 160" is composed of the magnetic substructure 100, 100', 100", and/or 100'''. Further, the reference layer reference layer 156" and/or the free layer 160" may include combinations of the magnetic substructures 100, 100', 100", and/or 100'''. Further other layers, such as polarization enhancement layers, may also be provided. For example, the reference layer 156" and/or the free layer 160" may include one or more CoFeB or FeB polarization enhancement layer. Note, however, that the reference layer 156" may still differ from the free layer 160". Thus, the specific combinations of magnetic substructure(s) 100, 100', 100" and/or 100''' and other layers used in the reference layer 156" may differ from those used in the free layer 160".

Because the magnetic substructure 100, 100', 100", and/or 100''' is used in the reference layer 156" and/or the free layer 160", the magnetic junction 150" may share the benefits of the magnetic substructure 100, 100', 100", and/or 100'''. In particular, the magnetic junction 150" may be thermally stable, have the desired magnetic moment, have improved lattice matching with an MgO barrier layer used as the nonmagnetic spacer layer 158, have the desired magnetic anisotropy and/or have lower magnetic damping. Thus, performance of the magnetic junction 150" may be improved.

Figure 11:
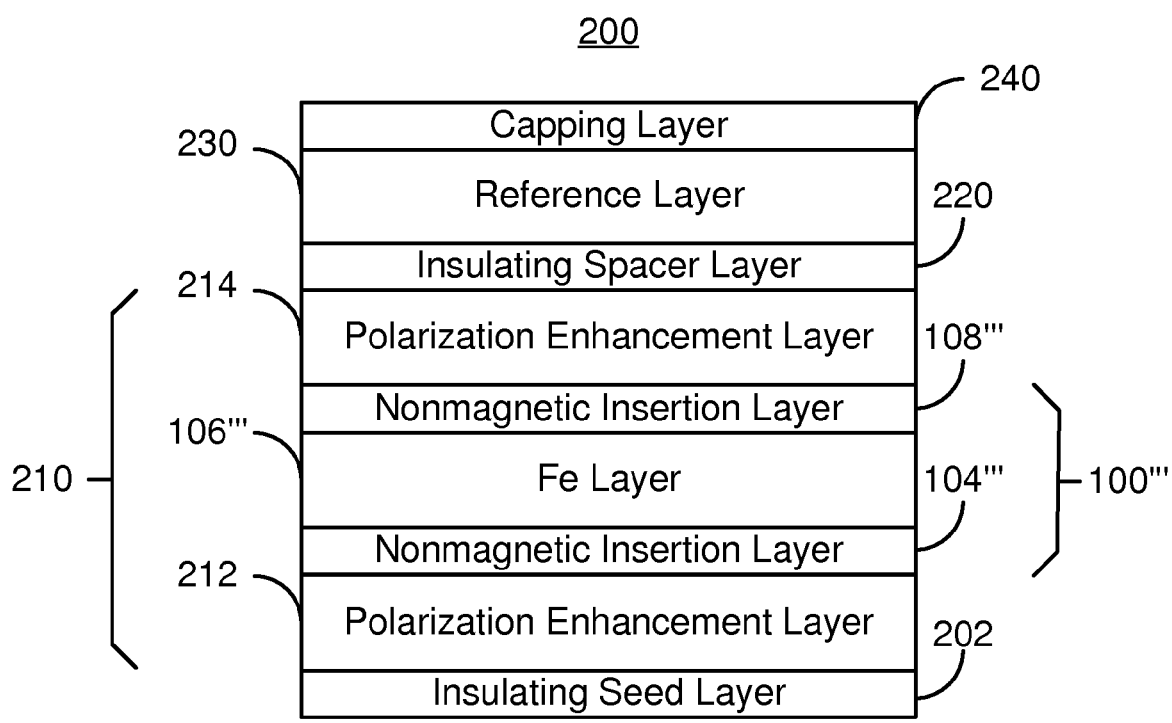
FIG. 11 depicts an exemplary embodiment of a magnetic junction including a magnetic substructure.

FIG. 11 depicts an exemplary embodiment of a magnetic junction 200 that may incorporate the magnetic substructure(s) 100, 100', 100", and/or 100'''. For clarity, FIG. 11 is not to scale. Although shown only a particular number of times, each of the substructures may be repeated multiple times. The magnetic junction 200 includes an optional insulating seed layer 202 such as MgO, a free layer 210, a nonmagnetic spacer layer 220 that may be an insulating spacer layer such as crystalline MgO, a reference layer 230 and optional capping layer 240. The optional capping layer 240 may be MgO. Such a capping layer may enhance the perpendicular magnetic anisotropy of the reference layer. In other embodiments, however, a different capping layer or no capping layer may be used. Although layers 210, 220 and 230 are shown with a particular orientation, this orientation may vary in other embodiments. For example, the reference layer 230 may be closer to the bottom (closest to a substrate that is not shown) of the magnetic junction 200. In some embodiments, for example where the magnetic moment is in-plane, an optional pinning layer (not shown) may be used to fix the magnetization (not shown) of the reference layer 230. In addition, although depicted as a simple layer, the reference layer 230 may be a SAF or other multilayer. The magnetic junction 200 may also be configured to allow the free layer 210 to be switched between stable magnetic states when a write current is passed through the magnetic junction 200. Thus, the free layer 210 may be switchable utilizing spin transfer torque.

The free layer 210 includes the magnetic substructure 100''' as well as polarization enhancement layers 212 and 214. The polarization enhancement layer 212 and/or 214 may include one or more of CoFeB and FeB. Further, the thicknesses of the nonmagnetic insertion layers 104''' and 108''' are desired to be sufficiently thin to allow ferromagnetic coupling between the ferromagnetic layers 212 and 106''' and between the ferromagnetic layers 106''' and 214. Thus, the materials and thicknesses of the layers 104''', 106''' and 108''' of the magnetic substructure 100''' are analogous to those described above.

Because the magnetic substructure 100''' is used in the free layer 210, the magnetic junction 200 may share the benefits of the magnetic substructure 100'''. In particular, the magnetic junction 200 may be thermally stable, have the desired magnetic moment, have improved lattice matching with an MgO barrier layer used as the nonmagnetic spacer layer 220, have the desired magnetic anisotropy and/or have lower magnetic damping. Thus, performance of the magnetic junction 150 may be improved Further, the anisotropy of the layers 212, 106''' and 214 may be tailored to achieve the desired switching of the free layer 210. For example, it may be desired to have the polarization enhancement layer 214 have a lower anisotropy than the layers 106'' and 212. In other words, the desired gradient in magnetic anisotropy between the layers 214, 106'' and 212 may be achieved. The desired switching characteristics may thus be achieved.

Figure 12:
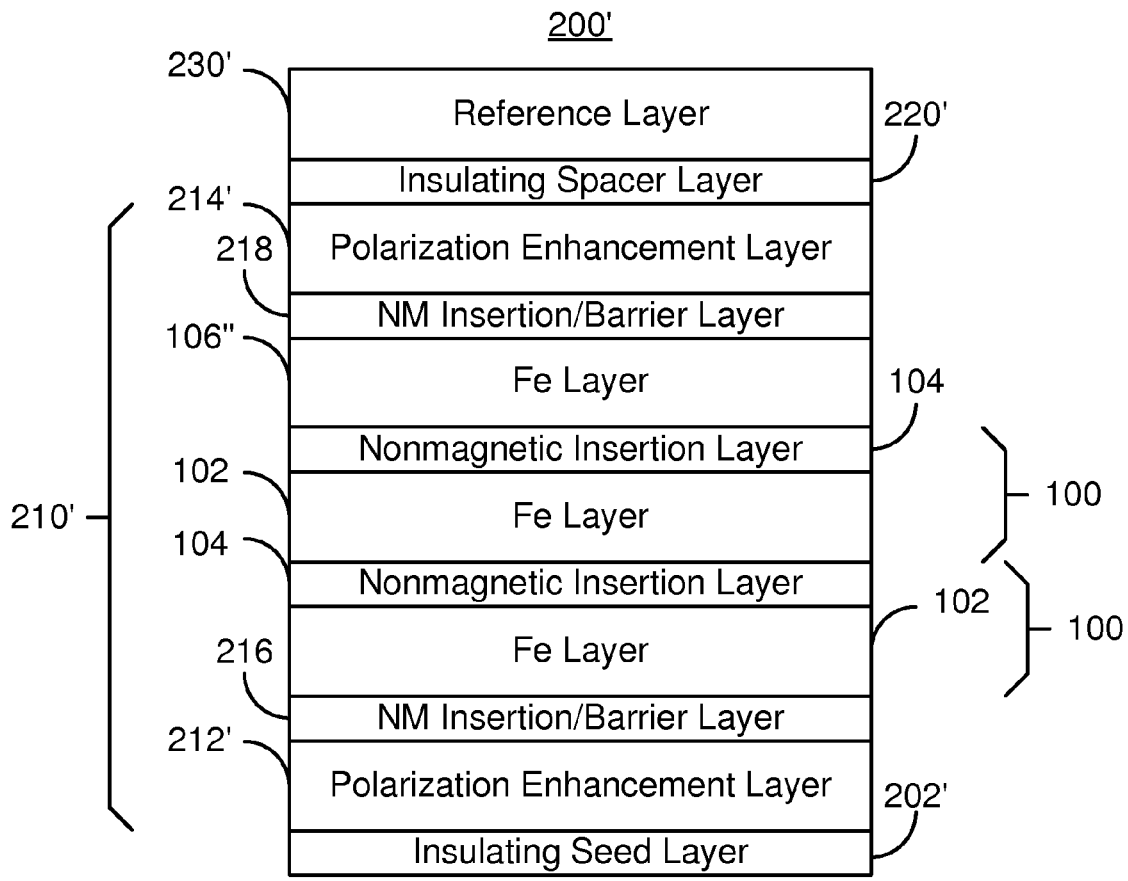
FIG. 12 depicts an exemplary embodiment of a magnetic junction including a magnetic substructure.

FIG. 12 depicts an exemplary embodiment of a magnetic junction 200' that may incorporate the magnetic substructure(s) 100, 100', 100'', and/or 100'''. For clarity, FIG. 12 is not to scale. Although shown only a particular number of times, each of the substructures may be repeated another number of times. The magnetic junction 200' includes an optional insulating seed layer 202' such as MgO, a free layer 210', a nonmagnetic spacer layer 220' that may be an insulating spacer layer such as crystalline MgO and a reference layer 230'. Although not shown, and optional capping layer may also be provided. The optional capping layer may be MgO. Such a capping layer may enhance the perpendicular magnetic anisotropy of the reference layer. Although layers 210', 220' and 230' are shown with a particular orientation, this orientation may vary in other embodiments. In some embodiments, for example where the magnetic moment is in-plane, an optional pinning layer (not shown) may be used to fix the magnetization (not shown) of the reference layer 230'. In addition, although depicted as a simple layer, the reference layer 230' may be a SAF or other multilayer. The magnetic junction 200' may also be configured to allow the free layer 210' to be switched between stable magnetic states when a write current is passed through the magnetic junction 200'. Thus, the free layer 210' may be switchable utilizing spin transfer torque.

The free layer 210' includes multiple magnetic substructures 100 as well as polarization enhancement layers 212' and 214'. The polarization enhancement layer 212' and/or 214' may include one or more of CoFeB and FeB. Also shown are insertion/barrier layers 216 and 218. These layers may be used to prevent materials, such as B, from diffusion out of the polarization enhancement layers 212' and 214' and into the remaining magnetic layers. In some embodiments, for example, where W of Hf is used for such layers, the layers 216 and 218 may also functions as nonmagnetic insertion layers that are part of the substructure. However, other barrier materials may be used. Examples of materials that may be used for the layers 216 and/or 218 includes but are not limited to W, Cr, Ta, Bi, Nb, Mo, Zn, Zr and Hf. Further, the thicknesses of the nonmagnetic insertion layers 104 and the layers 216 and 218 are desired to be sufficiently thin to allow ferromagnetic coupling between the ferromagnetic layers 212, 102, 106''' and 214. Thus, the materials and thicknesses of the layers 102, 104, and 106''' are analogous to those described above.

The magnetic junction 200' shares the benefits of the magnetic junction 200. Because the magnetic substructure 100 is used in the free layer 210', the magnetic junction 200' may share the benefits of the magnetic substructure 100. In particular, the magnetic junction 200' may be thermally stable, have the desired magnetic moment, have improved lattice matching with an MgO barrier layer used as the nonmagnetic spacer layer 220', have the desired magnetic anisotropy and/or have lower magnetic damping. Thus, performance of the magnetic junction 200 may be improved. Further, the anisotropy of the layers 212', 102'' and 214' may be tailored to achieve the desired switching of the free layer 210'. For example, it may be desired to have the polarization enhancement layer 214' have a lower anisotropy than the layers 102 and 212'. In other words, the desired gradient in magnetic anisotropy between the layers 214', 102 and 212' may be achieved. The desired switching characteristics may thus be achieved.

Figure 13:
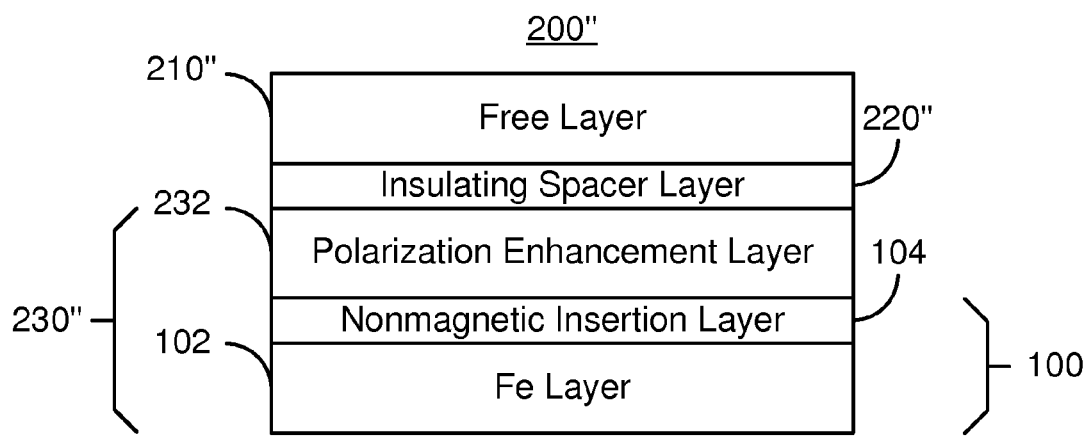
FIG. 13 depicts an exemplary embodiment of a magnetic junction including a magnetic substructure.

FIG. 13 depicts an exemplary embodiment of a magnetic junction 200'' that may incorporate the magnetic substructure(s) 100, 100', 100'', and/or 100'''. For clarity, FIG. 13 is not to scale. Although shown only a particular number of times, each of the substructures may be repeated another number of times. The magnetic junction 200'' includes a free layer 210'', a nonmagnetic spacer layer 220'' that may be an insulating spacer layer such as crystalline MgO and a reference layer 230''. Although not shown, optional capping and/or seed layers may also be provided. The optional capping layer and/or seed layers may be MgO, which enhance the perpendicular magnetic anisotropy of the layer 230'' and 210''. Although layers 210'', 220'' and 230'' are shown with a particular orientation, this orientation may vary in other embodiments. In some embodiments, for example where the magnetic moment is in-plane, an optional pinning layer (not shown) may be used to fix the magnetization (not shown) of the reference layer 230''. In addition, although depicted as a simple layer, the free layer 210'' may be a SAF or other multilayer. The free layer 210'' may also include some combination of the magnetic substructure(s) 100, 100', 100'', and/or 100'''. The magnetic junction 200'' may also be configured to allow the free layer 210'' to be switched between stable magnetic states when a write current is passed through the magnetic junction 200''. Thus, the free layer 210'' may be switchable utilizing spin transfer torque.

The reference layer 230'' includes one or more magnetic substructures 100 as well as polarization enhancement layer 232. The polarization enhancement layer 232 may include one or more of CoFeB and FeB. The thicknesses of the nonmagnetic insertion layers 104 are desired to be sufficiently small to allow ferromagnetic coupling between the ferromagnetic layers 232 and 102. Thus, the materials and thicknesses of the layers 102 and/or 104 are analogous to those described above.

The magnetic junction 200" shares the benefits of the magnetic junctions 200 and 200'. Because the magnetic substructure 100 is used in the reference layer 230", the magnetic junction 200" may share the benefits of the magnetic substructure 100. In particular, the magnetic junction 200" may be thermally stable, have the desired magnetic moment, have improved lattice matching with an MgO barrier layer used as the nonmagnetic spacer layer 220", have the desired magnetic anisotropy and/or have lower magnetic damping. Thus, performance of the magnetic junction 200" may be improved.

Figure 14:
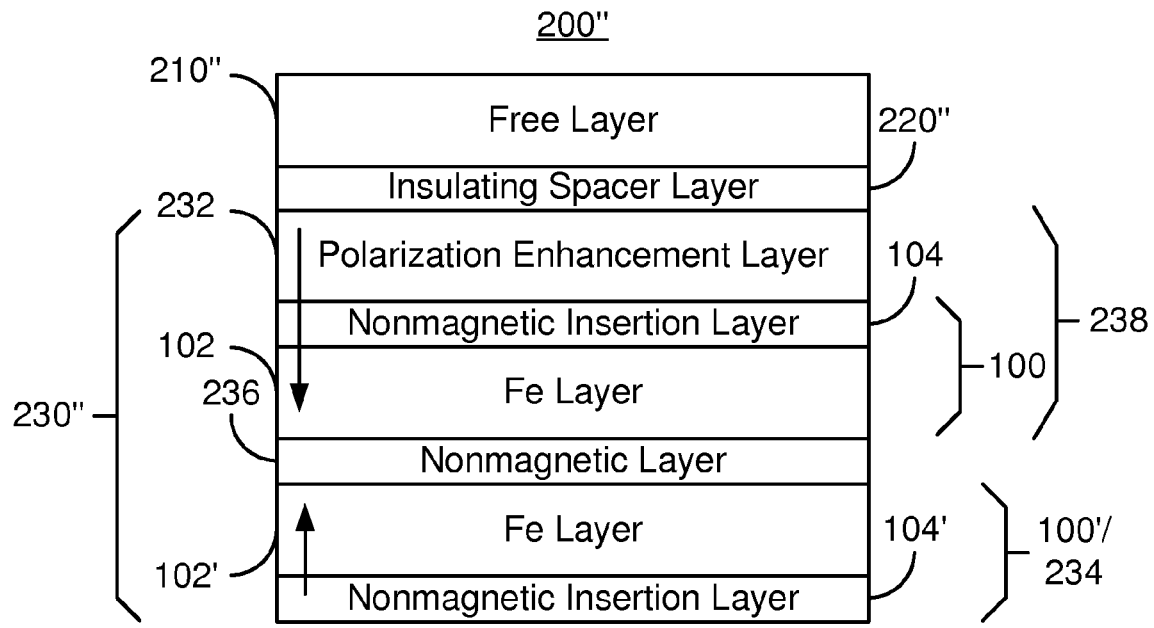
FIG. 14 depicts an exemplary embodiment of a magnetic junction including a magnetic substructure.

FIG. 14 depicts an exemplary embodiment of a magnetic junction 200" that may incorporate the magnetic substructure(s) 100, 100', 100", and/or 100'". For clarity, FIG. 14 is not to scale. The magnetic junction 200" includes a free layer 210", a nonmagnetic spacer layer 220" that may be an insulating spacer layer such as crystalline MgO and a reference layer 230". Although not shown, optional capping and/or seed layers may also be provided. The optional capping layer and/or seed layers may be MgO, which enhance the perpendicular magnetic anisotropy of the layer 230" and 210". Although layers 210", 220" and 230" are shown with a particular orientation, this orientation may vary in other embodiments. In some embodiments, for example where the magnetic moment is in-plane, an optional pinning layer (not shown) may be used to fix the magnetization (not shown) of the reference layer 230". In addition, although depicted as a simple layer, the free layer 210" may be a SAF or other multilayer. The free layer 210" may also include some combination of the magnetic substructure(s) 100, 100', 100", and/or 100'". The magnetic junction 200" may also be configured to allow the free layer 210" to be switched between stable magnetic states when a write current is passed through the magnetic junction 200". Thus, the free layer 210" may be switchable utilizing spin transfer torque.

The reference layer 230" includes one or more magnetic substructures 100 as well as polarization enhancement layer 232 and nonmagnetic layer 236. Although shown only once, each of the substructures 100 may be repeated multiple times. Thus, the magnetic substructures 100 are configured to acts as part of magnetic layers 234 and 238 that form a SAF. The polarization enhancement layer 232 may include one or more of CoFeB and FeB. The thicknesses of the nonmagnetic insertion layers 104 are desired to be sufficiently small to allow ferromagnetic coupling between the ferromagnetic layers 232 and 102. Thus, the layer 238 forms one magnetically cohesive layer in the SAF. Thus, the materials and thicknesses of the layers 102 and/or 104 are analogous to those described above.

The magnetic junction 200" shares the benefits of the magnetic junctions 200 and 200'. Because the magnetic substructure 100 is used in the reference layer 230", the magnetic junction 200" may share the benefits of the magnetic substructure 100. In particular, the magnetic junction 200" may be thermally stable, have the desired magnetic moment, have improved lattice matching with an MgO barrier layer used as the nonmagnetic spacer layer 220", have the desired magnetic anisotropy and/or have lower magnetic damping. Thus, performance of the magnetic junction 200" may be improved.

Figure 15:
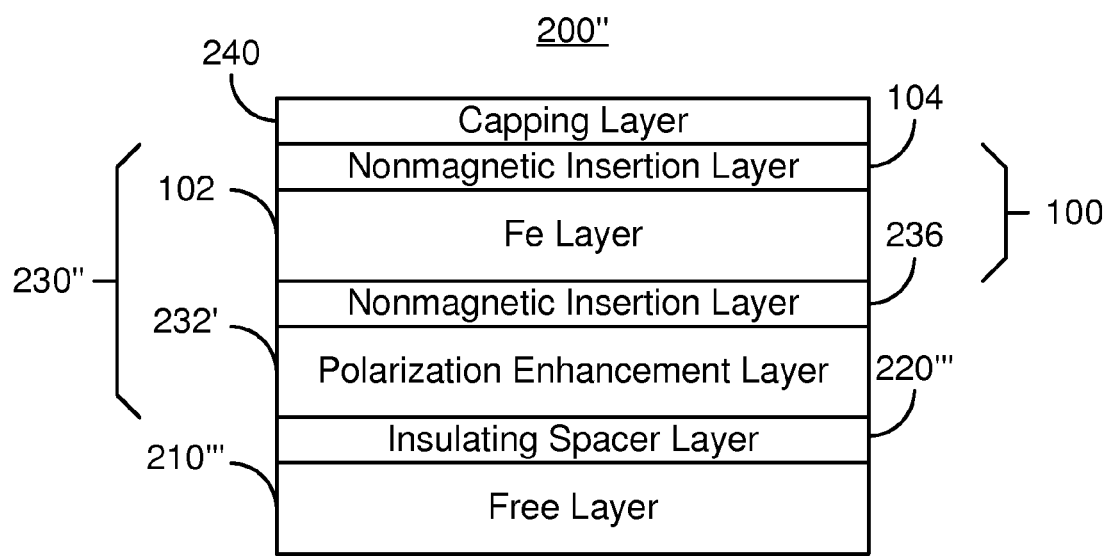
FIG. 15 depicts an exemplary embodiment of a magnetic junction including a magnetic substructure.

FIG. 15 depicts an exemplary embodiment of a magnetic junction 200" that may incorporate the magnetic substructure(s) 100, 100', 100", and/or 100'". For clarity, FIG. 14 is not to scale. Although shown once, the magnetic substructure may be repeated another number of times. The magnetic junction 200" includes a free layer 210", a nonmagnetic spacer layer 220" that may be an insulating spacer layer such as crystalline MgO and a reference layer 230". Although not shown, optional capping and/or seed layers may also be provided. The optional capping layer and/or seed layers may be MgO, which enhance the perpendicular magnetic anisotropy of the layer 230" and 210". Although layers 210", 220" and 230" are shown with a particular orientation, this orientation may vary in other embodiments. In some embodiments, for example where the magnetic moment is in-plane, an optional pinning layer (not shown) may be used to fix the magnetization (not shown) of the reference layer 230". In addition, although depicted as a simple layer, the free layer 210" may be a SAF or other multilayer. The free layer 210" may also include some combination of the magnetic substructure(s) 100, 100', 100", and/or 100'". The magnetic junction 200" may also be configured to allow the free layer 210" to be switched between stable magnetic states when a write current is passed through the magnetic junction 200". Thus, the free layer 210" may be switchable utilizing spin transfer torque.

The reference layer 230" includes one or more magnetic substructures 100 as well as polarization enhancement layer 232 and nonmagnetic layer 236. Although shown only once, each of the substructures 100 may be repeated multiple times. The polarization enhancement layer 232 may include one or more of CoFeB and FeB. The thicknesses of the nonmagnetic insertion layer 104 and 236 are desired to be sufficiently small to allow ferromagnetic coupling between the ferromagnetic layers 232' and 102. Thus, the layer 230 forms one magnetically cohesive layer. The materials and thicknesses of the layers 102 and/or 104 are analogous to those described above.

The magnetic junction 200" shares the benefits of the magnetic junctions 200 and 200'. Because the magnetic substructure 100 is used in the reference layer 230", the magnetic junction 200" may share the benefits of the magnetic substructure 100. In particular, the magnetic junction 200" may be thermally stable, have the desired magnetic moment, have improved lattice matching with an MgO barrier layer used as the nonmagnetic spacer layer 220", have the desired magnetic anisotropy and/or have lower magnetic damping. Further, this performance may be achieved without the use of materials having an HCP crystal structure in the reference layer 230". Such materials may be difficult to adequately fabricate. Thus, performance and fabrication of the magnetic junction 200" may be improved.

Figure 16:
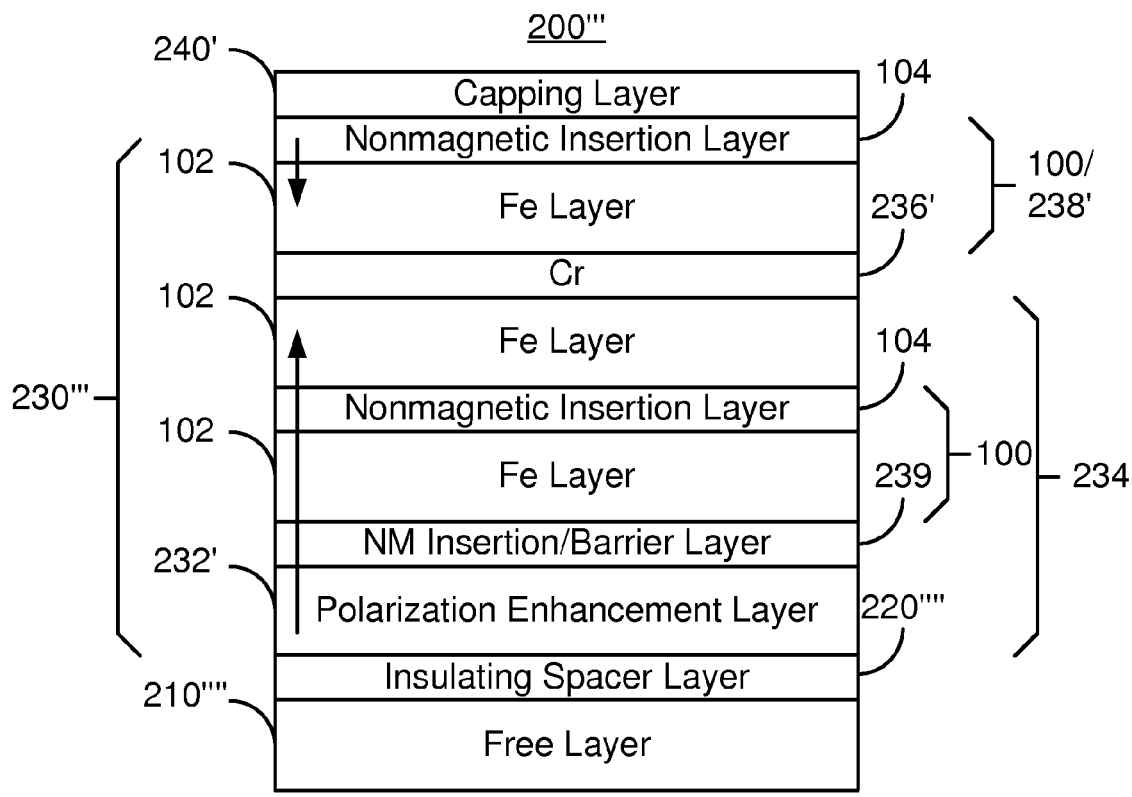
FIG. 16 depicts an exemplary embodiment of a magnetic junction including a magnetic substructure.

FIG. 16 depicts an exemplary embodiment of a magnetic junction 200'" that may incorporate the magnetic substructure(s) 100, 100', 100", and/or 100'". For clarity, FIG. 16 is not to scale. The magnetic junction 200'" includes a free layer 210'", a nonmagnetic spacer layer 220'" that may be an insulating spacer layer such as crystalline MgO and a reference layer 230'". Although not shown, optional capping and/or seed layers may also be provided. The optional capping layer and/or seed layers may be MgO, which enhance the perpendicular magnetic anisotropy of the layer 230'" and 210'". Although layers 210'", 220'" and 230'" are shown with a particular orientation, this orientation may vary in other embodiments. In some embodiments, for example where the magnetic moment is in-plane, an optional pinning layer (not shown) may be used to fix the magnetization (not shown) of the reference layer 230". In addition, although depicted as a simple layer, the free layer 210'" may be a SAF or other multilayer. The free layer 210" may also include some combination of the magnetic substructure(s) 100, 100', 100", and/or 100". The magnetic junction 200'" may also be configured to allow the free layer 210'" to be switched between stable magnetic states when a write current is passed through the magnetic junction 200'". Thus, the free layer 210'" may be switchable utilizing spin transfer torque.

The reference layer 230'" includes one or more magnetic substructures 100 as well as polarization enhancement layer 232' and nonmagnetic layer 236'. Although shown only once, each of the substructures 100 may be repeated multiple times. Thus, the magnetic substructures 100 are configured to acts as part of magnetic layers 234' and 238 that form a SAF. The polarization enhancement layer 232' may include one or more of CoFeB and FeB. The thicknesses of the nonmagnetic insertion layers 104 are desired to be sufficiently small to allow ferromagnetic coupling between the ferromagnetic layers 232' and 102. The layer 238' forms one magnetically cohesive layer in the SAF. Thus, the materials and thicknesses of the layers 102 and/or 104 are analogous to those described above. Further, the nonmagnetic layer 236' may be Cr or analogous material(s). Analogous materials may include one or more of Ru, Rh, Re, V, Mo and Ir. Such a nonmagnetic layer 236' allows for an antiferromagnetic (e.g. RKKY) coupling between the layers 238' and 234'. In addition, the layer 236' has a BCC crystal structure. As such, the layer 236' may act as a seed layer for the Fe layer 102. The nonmagnetic insertion/barrier layer 239 may include materials such as W and/or Ta. Such a layer may act as a barrier layer to reduce or prevent diffusion of materials such as B for the polarization enhancement layer 232'. Further, if the layer 232' includes W, the interface between the Fe layer 102 and the layer 239 may further enhance the magnetic anisotropy of the magnetic junction 200'''.

The magnetic junction 200''' shares the benefits of the magnetic junctions 200, 200' and 200''. Because the magnetic substructure 100 is used in the reference layer 230''', the magnetic junction 200''' may share the benefits of the magnetic substructure 100. In particular, the magnetic junction 200''' may be thermally stable, have the desired magnetic moment, have improved lattice matching with an MgO barrier layer used as the nonmagnetic spacer layer 220''', have the desired magnetic anisotropy and/or lower magnetic damping. Further, the magnetic junction 200''' includes a SAF and a barrier layer to reduce or prevent diffusion of undesirable materials from the polarization enhancement layer 232'. Thus, performance and reliability of the magnetic junction 200''' may be improved.

Figure 17:
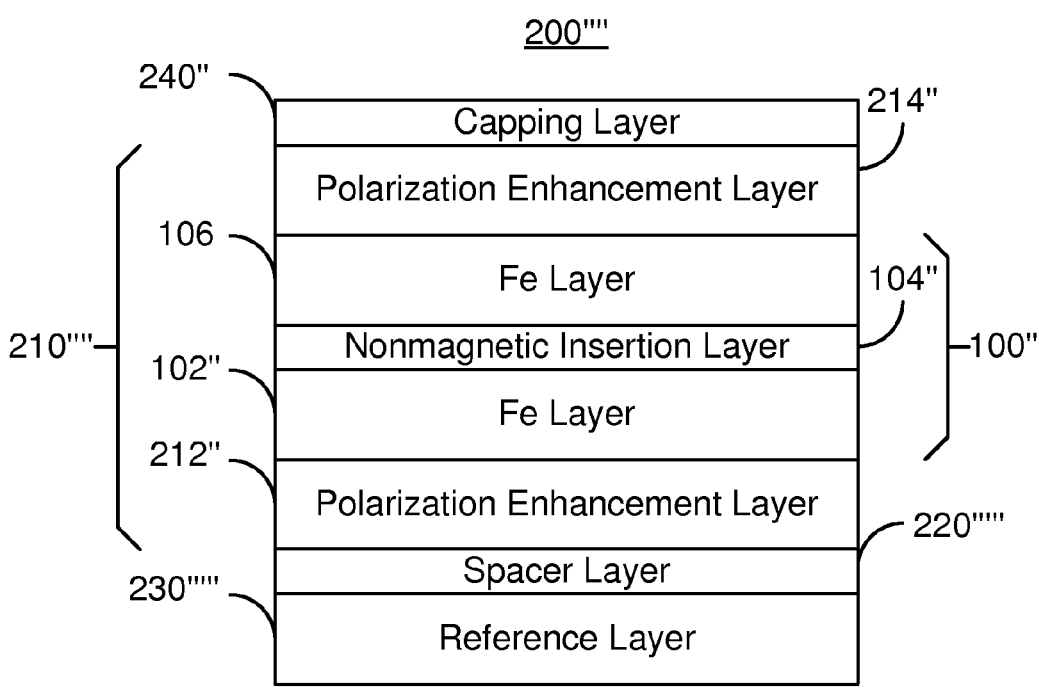
FIG. 17 depicts an exemplary embodiment of a magnetic junction including a magnetic substructure.

FIG. 17 depicts an exemplary embodiment of a magnetic junction 200'''' that may incorporate the magnetic substructure(s) 100, 100', 100'', and/or 100'''. For clarity, FIG. 17 is not to scale. The magnetic junction 200'''' includes a free layer 210'''', a nonmagnetic spacer layer 220'''' that may be an insulating spacer layer such as crystalline MgO and a reference layer 230''''. Although not shown, an optional seed layer may also be provided. The optional seed layer may be MgO, which enhance the perpendicular magnetic anisotropy of the layer 230'''' and 210''''. Although layers 210'''', 220'''' and 230'''' are shown with a particular orientation, this orientation may vary in other embodiments. In some embodiments, for example where the magnetic moment is in-plane, an optional pinning layer (not shown) may be used to fix the magnetization (not shown) of the reference layer 230''''. In addition, although depicted as a simple layer, the reference layer 230'''' may be a SAF or other multilayer. The reference layer 230'''' may also include some combination of the magnetic substructure(s) 100, 100', 100'', and/or 100'''. The magnetic junction 200'''' may also be configured to allow the free layer 210'''' to be switched between stable magnetic states when a write current is passed through the magnetic junction 200''''. Thus, the free layer 210'''' may be switchable utilizing spin transfer torque.

The free layer 210'''' includes one or more magnetic substructures 100''' as well as polarization enhancement layers 212'' and 214''. Although shown only once, each of the substructures 100''' may be repeated multiple times. Thus, the magnetic substructures 100'' are configured to acts as part of magnetic layers the free layer 210'''. The polarization enhancement layer 212'' and/or 214'' may include one or more of CoFeB and FeB. The thicknesses of the nonmagnetic insertion layers 104 are desired to be sufficiently small to allow ferromagnetic coupling between the ferromagnetic layers 212'' and 102'' and 214'' and 106. The top capping layer 240'' is also shown. In some embodiments, the capping layer 240'' would be crystalline MgO in order enhance the magnetic anisotropy of the polarization enhancement layer 214''. However, in the embodiment shown, the capping layer 240'' may be conductive. Materials such as Ta, W, V or other conductive capping layers may be used. For such embodiments, the desired perpendicular magnetic anisotropy for the free layer may be provided by the desired magnetic substructure(s) 100''. The perpendicular magnetic anisotropy provided by a crystalline MgO cap layer 240'' may be superfluous. Thus, a conductive cap 240'' may be used. Issues in connecting to the magnetic junction 200'''' and other similar issues due to an MgO capping layer may thus be avoided. Performance and manufacturability of the magnetic junction 200'''' may thus be improved.

The magnetic junction 200'''' shares the benefits of the magnetic junctions 200, 200', 200'' and 200'''. Because the magnetic substructure 100'' is used in the free layer 210'''', the magnetic junction 200'''' may share the benefits of the magnetic substructure 100''. In particular, the magnetic junction 200'''' may be thermally stable, have the desired magnetic moment, have improved lattice matching with an MgO barrier layer used as the nonmagnetic spacer layer 220'''', have the desired magnetic anisotropy and/or lower magnetic damping. Further, the use of insulating in-stack seed and/or capping layers may be avoided. Thus, performance, manufacturability and reliability of the magnetic junction 200'''' may be improved.

Figure 18:
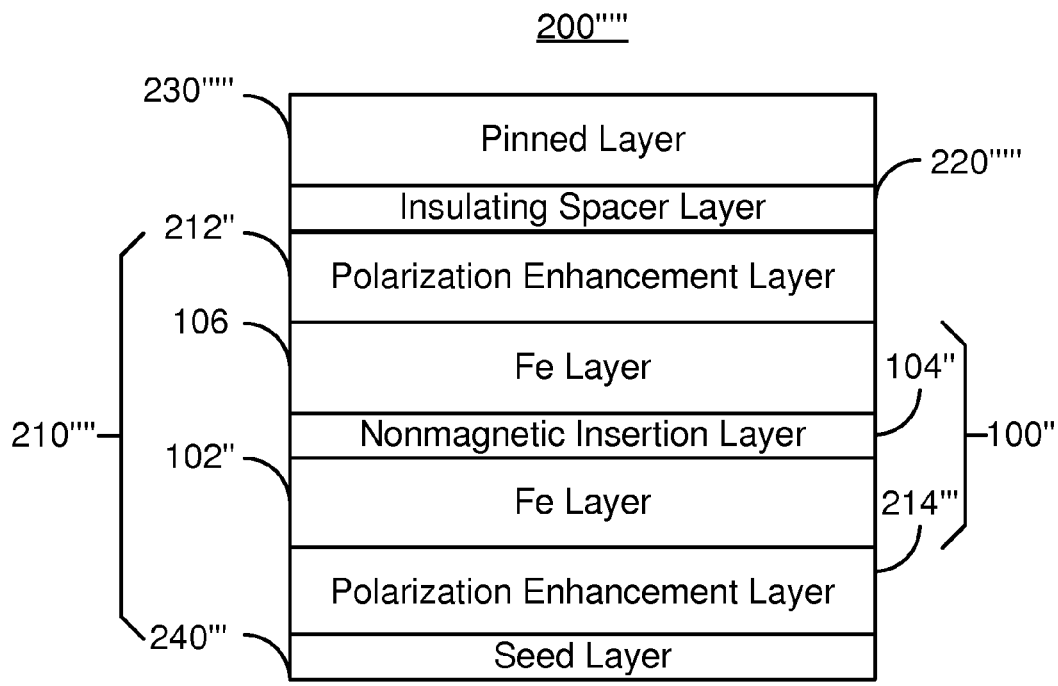
FIG. 18 depicts an exemplary embodiment of a magnetic junction including a magnetic substructure.

FIG. 18 depicts an exemplary embodiment of a magnetic junction 200''''' that may incorporate the magnetic substructure(s) 100, 100', 100'', and/or 100'''. For clarity, FIG. 18 is not to scale. The magnetic junction 200''''' includes a free layer 210''''', a nonmagnetic spacer layer 220''''' that may be an insulating spacer layer such as crystalline MgO and a reference layer 230'''''. Although not shown, an optional capping layer may also be provided. The optional capping layer may be MgO, which enhance the perpendicular magnetic anisotropy of the layer 230'''''. Although layers 210''''', 220''''' and 230''''' are shown with a particular orientation, this orientation may vary in other embodiments. In some embodiments, for example where the magnetic moment is in-plane, an optional pinning layer (not shown) may be used to fix the magnetization (not shown) of the reference layer 230'''''. In addition, although depicted as a simple layer, the reference layer 230''''' may be a SAF or other multilayer. The reference layer 230''''' may also include some combination of the magnetic substructure(s) 100, 100', 100'', and/or 100'''. The magnetic junction 200''''' may also be configured to allow the free layer 210''''' to be switched between stable magnetic states when a write current is passed through the magnetic junction 200'''''. Thus, the free layer 210''''' may be switchable utilizing spin transfer torque.

The free layer 210''''' includes one or more magnetic substructures 100''' as well as polarization enhancement layers 212'' and 214''. Although shown only once, each of the substructures 100''' may be repeated multiple times. Thus, the magnetic substructures 100''' are configured to acts as part of magnetic layers the free layer 210'''''. The polarization enhancement layer 212''' and/or 214''' may include one or more of CoFeB and FeB. The thicknesses of the nonmagnetic insertion layers 104 are desired to be sufficiently small to allow ferromagnetic coupling between the ferromagnetic layers 212''' and 102''' and 214''' and 106. The seed layer 240''' is also shown. In some embodiments, the seed layer 240''' would be crystalline MgO in order enhance the magnetic anisotropy of the polarization enhancement layer 214'''. However, in the embodiment shown, the seed layer 240''' may be conductive. Materials such as Ta, W, V or other conductive capping layers may be used. For such embodiments, the desired perpendicular magnetic anisotropy for the free layer may be provided by the desired magnetic substructure(s) 100''. The perpendicular magnetic anisotropy provided by a crystalline MgO seed layer 240''' may be superfluous. Thus, a conductive seed layer 240''' may be used. Issues in connecting to the magnetic junction 200'''' and other similar issues due to an MgO capping layer may thus be avoided. Performance and manufacturability of the magnetic junction 200'''' may thus be improved.

The magnetic junction 200'''' shares the benefits of the magnetic junctions 200, 200', 200'', 200''' and 200''''. Because the magnetic substructure 100'' is used in the free layer 210'''', the magnetic junction 200'''' may share the benefits of the magnetic substructure 100''. In particular, the magnetic junction 200'''' may be thermally stable, have the desired magnetic moment, have improved lattice matching with an MgO barrier layer used as the nonmagnetic spacer layer 220''', have the desired magnetic anisotropy and/or lower magnetic damping. Further, the use of insulating in-stack seed layer may be avoided. Thus, performance, manufacturability and reliability of the magnetic junction 200'''' may be improved.

Figure 19:
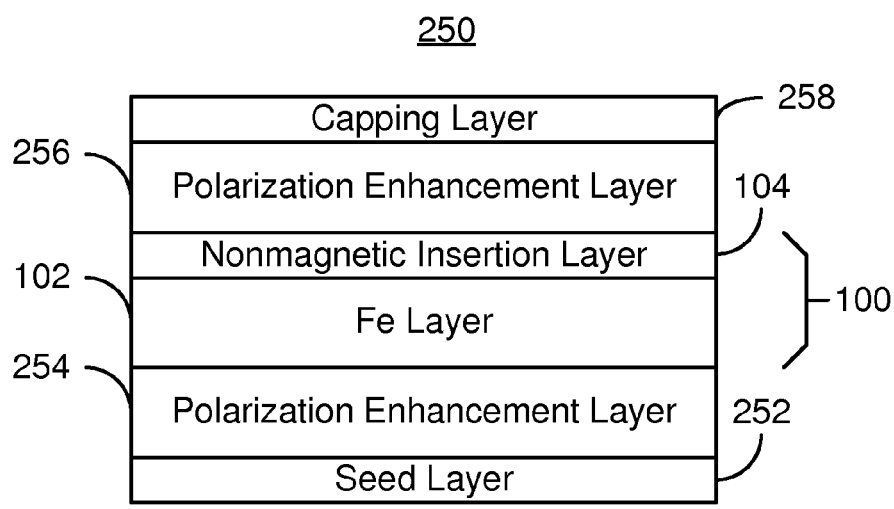
FIG. 19 depicts an exemplary embodiment of a layer for a magnetic junction that includes a magnetic substructure.

FIGS. 19-22 depict exemplary embodiments of layers using one or more embodiments of the magnetic substructure. FIG. 19 depicts an exemplary embodiment of a magnetic layer 250 that may incorporate the magnetic substructure(s) 100, 100', 100'', and/or 100'''. For clarity, FIG. 19 is not to scale. The magnetic layer 250 may be used as a free layer, a reference layer or other magnetic layer in a device. The magnetic layer 250 includes one or more magnetic substructures 100, seed layer 252, capping layer 258 and polarization enhancement layers 254 and 256. Although shown only once, each of the substructures 100 may be repeated multiple times. Further, as discussed above, different magnetic substructures may be combined. Thus, the magnetic substructure 100 is configured to acts as part of the magnetic layer 250. The polarization enhancement layer 254 and/or 256 may include one or more of CoFeB and FeB. The thicknesses of the nonmagnetic insertion layers 104 are desired to be sufficiently small to allow ferromagnetic coupling between the ferromagnetic layers 256 and 102. In some embodiments, the seed layer 252 and/or capping layer 258 would be crystalline MgO. For example, the layer 252 and/or 258 may be the tunneling barrier layer(s) in a magnetic junction.

A magnetic junction employing the layer 250 may share the benefits of the magnetic junctions 200, 200', 200'', 200''' and 200'''' and the magnetic substructures 100, 100', 100'', 100'''. In particular, the magnetic layer 250 may be thermally stable, have the desired magnetic moment, have improved lattice matching with an MgO barrier layer used, have the desired magnetic anisotropy and/or have lower magnetic damping. Thus, performance, manufacturability and reliability of the magnetic junction employing the layer 250 may be improved.

Figure 20:
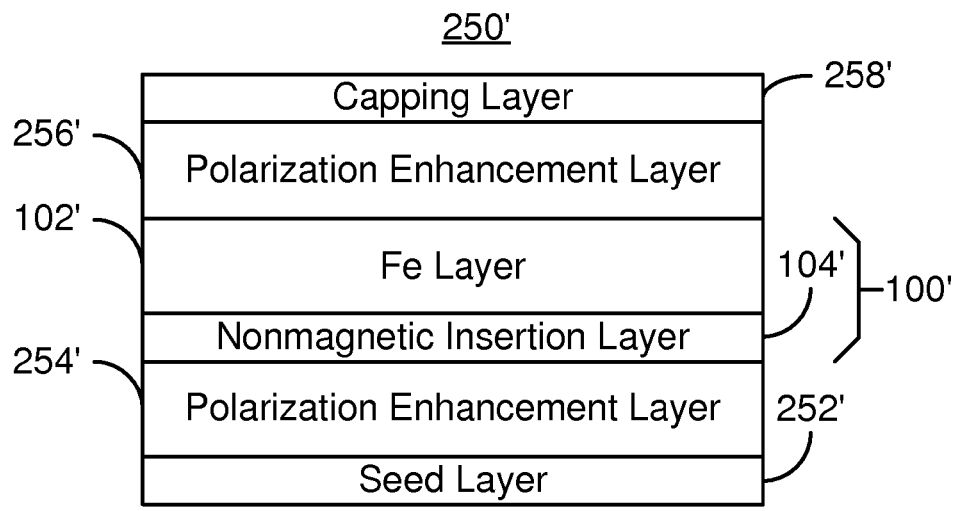
FIG. 20 depicts an exemplary embodiment of a layer for a magnetic junction that includes a magnetic substructure.

FIG. 20 depicts an exemplary embodiment of a magnetic layer 250' that may incorporate the magnetic substructure(s) 100, 100', 100'', and/or 100'''. For clarity, FIG. 20 is not to scale. The magnetic layer 250' may be used as a free layer, a reference layer or other magnetic layer in a device. The magnetic layer 250' includes one or more magnetic substructures 100', seed layer 252', capping layer 258' and polarization enhancement layers 254' and 256'. Although shown only once, each of the substructures 100 may be repeated multiple times. Further, as discussed above, different magnetic substructures may be combined. Thus, the magnetic substructure 100' is configured to acts as part of the magnetic layer 250. The polarization enhancement layer 254' and/or 256' may include one or more of CoFeB and FeB. The thicknesses of the nonmagnetic insertion layers 104'' are desired to be sufficiently small to allow ferromagnetic coupling between the ferromagnetic layers 254' and 102'. In some embodiments, the seed layer 252' and/or capping layer 258' would be crystalline MgO'. For example, the layer 252' and/or 258' may be the tunneling barrier layer(s) in a magnetic junction.

A magnetic junction employing the layer 250' may share the benefits of the magnetic junctions 200, 200', 200'', 200''' and 200'''' and the magnetic substructures 100, 100', 100'', 100'''. In particular, the magnetic layer 250' may be thermally stable, have the desired magnetic moment, have improved lattice matching with an MgO barrier layer used, have the desired magnetic anisotropy and/or have lower magnetic damping. Thus, performance, manufacturability and reliability of the magnetic junction employing the layer 250' may be improved.

Figure 21:
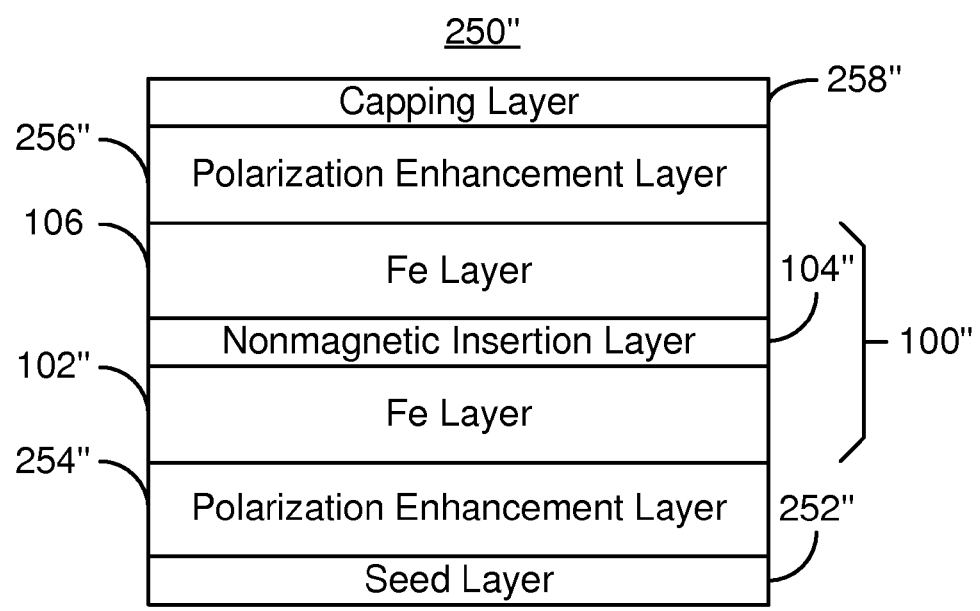
FIG. 21 depicts an exemplary embodiment of a layer for a magnetic junction that includes a magnetic substructure.

FIG. 21 depicts an exemplary embodiment of a magnetic layer 250'' that may incorporate the magnetic substructure(s) 100, 100', 100'', and/or 100'''. For clarity, FIG. 21 is not to scale. The magnetic layer 250'' may be used as a free layer, a reference layer or other magnetic layer in a device. The magnetic layer 250'' includes one or more magnetic substructures 100'', seed layer 252'', capping layer 258'' and polarization enhancement layers 254'' and 256''. Although shown only once, each of the substructures 100'' may be repeated multiple times. Further, as discussed above, different magnetic substructures may be combined. Thus, the magnetic substructure 100'' is configured to acts as part of the magnetic layer 250. The polarization enhancement layer 254'' and/or 256'' may include one or more of CoFeB and FeB. The thicknesses of the nonmagnetic insertion layers 104''' are desired to be sufficiently small to allow ferromagnetic coupling between the ferromagnetic layers 102'' and 106. Thus, the thickness of the nonmagnetic insertion layer 104'' may allow for exchange coupling between the layers 102'' and 106. In some embodiments, the seed layer 252'' and/or capping layer 258'' would be crystalline MgO'. For example, the layer 252'' and/or 258'' may be the tunneling barrier layer(s) in a magnetic junction.

A magnetic junction employing the layer 250'' may share the benefits of the magnetic junctions 200, 200', 200'', 200''' and 200'''' and the magnetic substructures 100, 100', 100'', 100'''. In particular, the magnetic layer 250'' may be thermally stable, have the desired magnetic moment, have improved lattice matching with an MgO barrier layer used, have the desired magnetic anisotropy and/or have lower magnetic damping. Thus, performance, manufacturability and reliability of the magnetic junction employing the layer 250'' may be improved. Further, more interfaces between the Fe layers 102'' and 106 and the nonmagnetic insertion layer 104'' are present than for the layers 250 and 250'. As it is believed that the perpendicular magnetic anisotropy is related to the presence of such interfaces, it is believe that the layer 250'' may have a higher perpendicular magnetic anisotropy.

Figure 22:
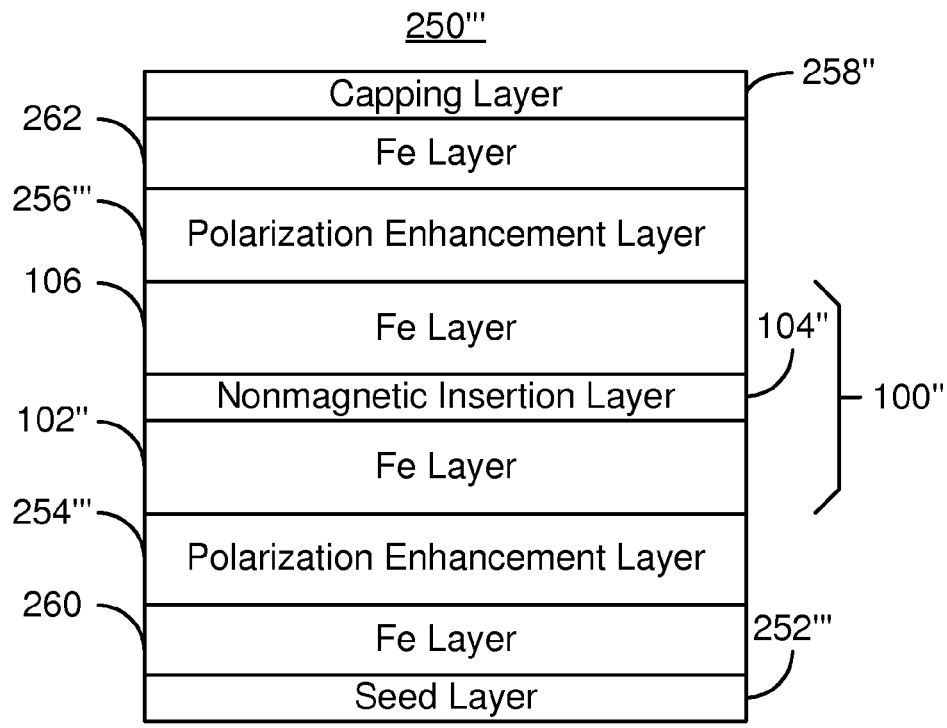
FIG. 22 depicts an exemplary embodiment of a layer for a magnetic junction that includes a magnetic substructure.

FIG. 22 depicts an exemplary embodiment of a magnetic layer 250''' that may incorporate the magnetic substructure(s) 100, 100', 100'', and/or 100'''. For clarity, FIG. 22 is not to scale. The magnetic layer 250''' may be used as a free layer, a reference layer or other magnetic layer in a device. The magnetic layer 250'' includes one or more magnetic substructures 100'', seed layer 252''', capping layer 258''' and polarization enhancement layers 254''' and 256'''. Thus, the magnetic layer 250''' is analogous to the magnetic layer 250''. In addition, the magnetic layer 250''' includes two additional Fe layers 260 and 262. The additional Fe layers 260 and 262 may be used to enhance the spin polarization for the magnetic layers 254''' and 256'''. Thus, switching using spin transfer torque may occur at a lower current.

A magnetic junction employing the layer 250''' may share the benefits of the magnetic junctions 200, 200', 200'', 200''', 200'''' and 200''''' and the magnetic substructures 100, 100', 100'', 100'''. In particular, the magnetic layer 250'' may be thermally stable, have the desired magnetic moment, have improved lattice matching with an MgO barrier layer used, have the desired magnetic anisotropy and/or have lower magnetic damping. Thus, performance, manufacturability and reliability of the magnetic junction employing the layer 250'' may be improved.

Figure 23:
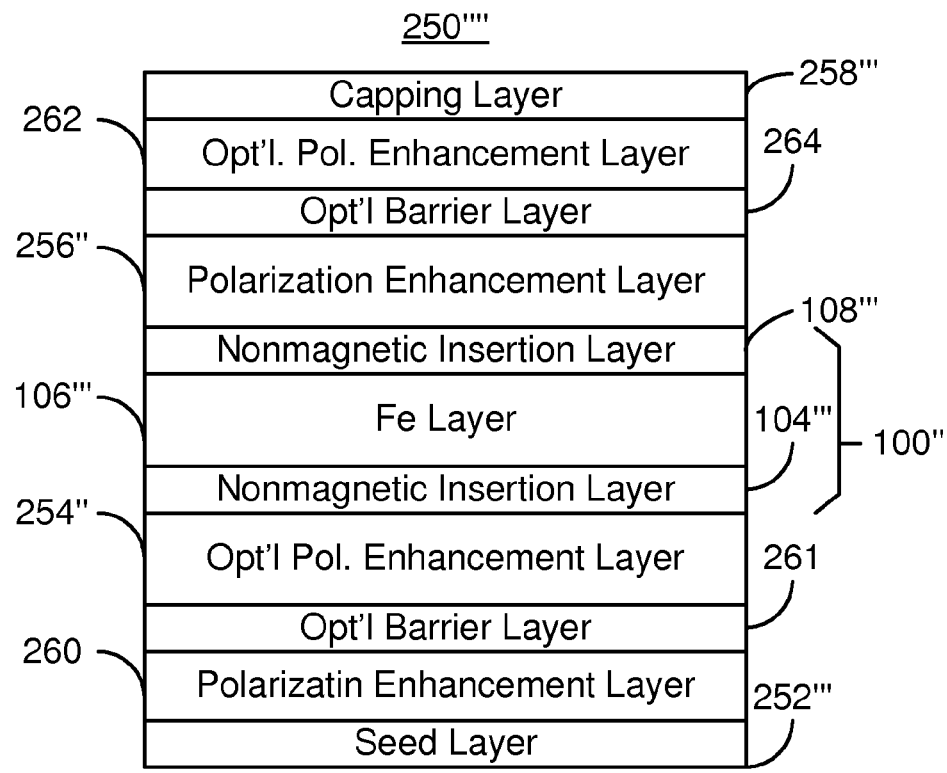
FIG. 23 depicts an exemplary embodiment of a magnetic junction that includes a magnetic substructure.

FIG. 23 depicts an exemplary embodiment of a magnetic layer 250'''' that may incorporate the magnetic substructure(s) 100, 100', 100'', and/or 100'''. For clarity, FIG. 23 is not to scale. The magnetic layer 250'''' may be used as a free layer, a reference layer or other magnetic layer in a device. The magnetic layer 250''' includes one or more magnetic substructures 100''', seed layer 252'''', capping layer 258'''' and polarization enhancement layers 254'''' and 256''''. Thus, the magnetic layer 250'''' is analogous to the magnetic layer 250''. In addition, the magnetic layer 250''' includes two optional diffusion barrier layers 261 and 264. For example, the diffusion barrier layers may include but is not limited to materials such as Ta, Hf, and Zr. Because of the presence of the barrier layers 261 and 264, unwanted elements, such as B, may be precluded from diffusing from layers 260 and/or 262 into the remaining portion of the junction.

A magnetic junction employing the layer 250'''' may share the benefits of the magnetic junctions 200, 200', 200'', 200''', 200'''' and 200''''' and the magnetic substructures 100, 100', 100'', 100'''. In particular, the magnetic layer 250''' may be thermally stable, have the desired magnetic moment, have improved lattice matching with an MgO barrier layer used, have the desired magnetic anisotropy and/or lower magnetic damping. In addition, the diffusion of unwanted materials, such as B may be reduced or eliminated. Thus, performance, manufacturability and reliability of the magnetic junction employing the layer 250'''' may be improved.

Figure 24:
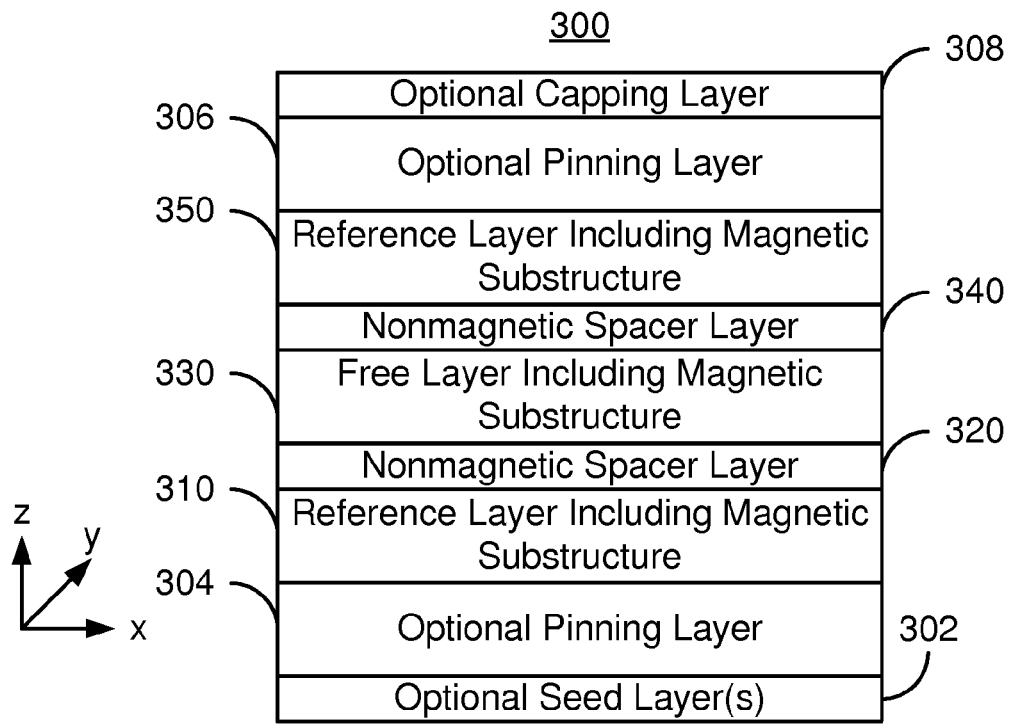
FIG. 24 depicts an exemplary embodiment of a dual magnetic junction that includes a magnetic substructure.

For example, FIG. 24 depicts one embodiment of a dual magnetic junction 300 that may incorporate the magnetic substructure(s) 100, 100', 100'', and/or 100'''. For clarity, FIG. 24 is not to scale. The magnetic junction 300 includes an optional seed layer 302, an optional pinning layer 304, a first reference layer 310, a first nonmagnetic spacer layer 320, a free layer 330, a second nonmagnetic spacer layer 340, a second reference layer 350, an optional second pinning layer 306 and an optional capping layer 308. The optional pinning layers 304 and 306 may be used to fix the magnetization (not shown) of the reference layer 310 and 350, respectively. However, in other embodiments, the optional pinning layers 304 and 306 may be omitted or another structure may be used. The magnetic junction 300 may also be configured to allow the free layer 330 to be switched between stable magnetic states when a write current is passed through the magnetic junction 300. Thus, the free layer 330 is switchable utilizing spin transfer torque.

The spacer layers 320 and 340 are nonmagnetic. In some embodiments, the spacer layers 320 and 340 are insulators, for example tunneling barriers. In such embodiments, the spacer layers 320 and 340 may include crystalline MgO, which may enhance the TMR of the magnetic junction. In other embodiments, the spacer layer may be a conductor, such as Cu. In alternate embodiments, the spacer layers 320 and 340 are might have another structure, for example a granular layer including conductive channels in an insulating matrix.

One or more of the free layer 330, the first reference layer 310 and the second reference layer 350 may include some combination of one or more iterations of the magnetic substructure 100, 100', 100'', and/or 100'''. In some embodiments, the free layer 330, the first reference layer 310 and/or the second reference layer 350 is composed of the magnetic substructure 100, 100', 100'', and/or 100'''. In other embodiments, other layers, such as polarization enhancement layers, may also be provided in the free layer 330, the first reference layer 310 and/or the second reference layer 350. For example, the free layer 160 may include one or more CoFeB or FeB polarization enhancement layer.

Because the magnetic substructure 100, 100', 100'', and/or 100''' is used in the first reference layer 310, the free layer 330, and/or the second reference layer 350, the magnetic junction 200 may share the benefits of the magnetic substructure 100, 100', 100'', and/or 100'''. In particular, the magnetic junction 200 may be thermally stable, have the desired magnetic moment, have improved lattice matching with an MgO barrier layer used as the nonmagnetic spacer layer 158, have the desired magnetic anisotropy and/or have lower magnetic damping. Further, advantages of a dual magnetic junction such as enhanced TMR in the antidual state (magnetic moments of layers 310 and 350 parallel) and enhanced spin transfer torque in the dual state (magnetic moments of the layers 310 and 350 antiparallel). Thus, performance of the magnetic junction 200 may be improved.

Figure 25:
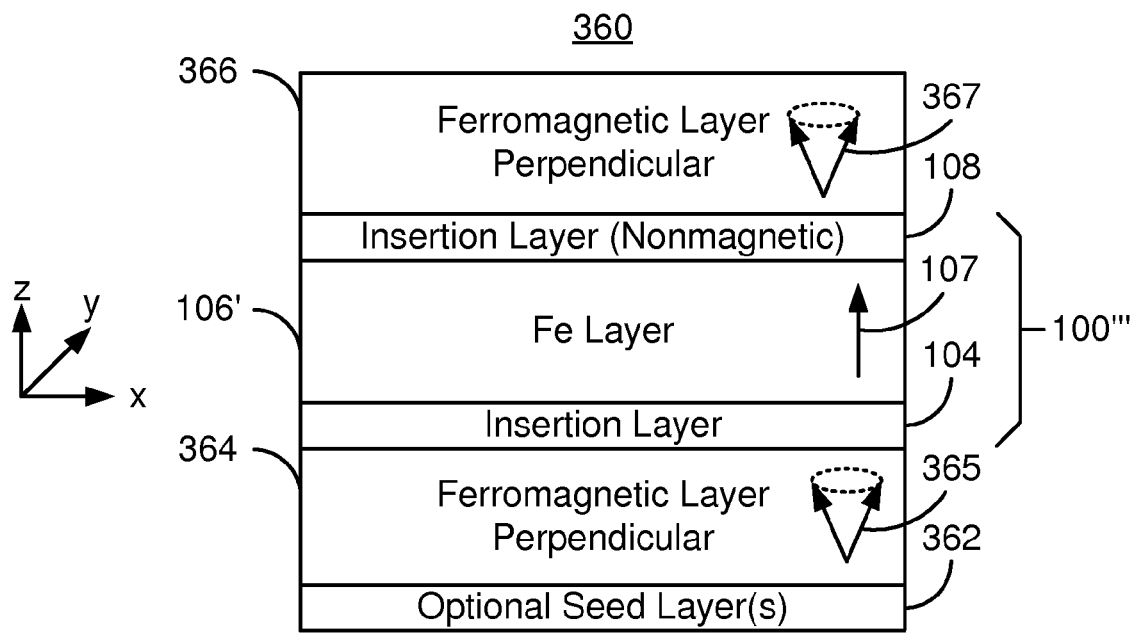
FIG. 25 depicts an exemplary embodiment of a layer for magnetic junction that includes a magnetic substructure.

FIG. 25 depicts an exemplary embodiment of a layer 360 including one or more of the magnetic substructures 100, 100', 100'' and/or 100'''. For clarity, FIG. 25 is not to scale. The layer 360 may be used in a magnetic junction in which a faster write time and lower write error rate may be desired. In the embodiment shown, the layer 360 includes a magnetic substructure 100'''. However, in other embodiments, other magnetic substructures may be used. The layer 360 may include optional seed layer(s) 362, and soft ferromagnetic layers 364 and 366. The soft magnetic layers 364 and 366 may, for example, include CoFeB with not more than thirty percent B. In the embodiment shown, the layers 364 and 366 have a weak in-plane anisotropy. Thus, without more, the magnetizations of the ferromagnetic layers 364 and 366 might be are in plane. The Fe layer 106' is strongly perpendicular because of the interfaces in the magnetic substructure 100'''. In some embodiments, the layer 106' is thicker than the layers 364 and 366. Further, the magnetic substructure 100''' is magnetically stable at room temperature. In some embodiments, the magnetic anisotropy energy for the magnetic substructure 100''' is at least sixty times $k_bT$ at room temperature. In some such embodiments, the magnetic anisotropy energies for the magnetic substructure 100''' is at least eighty times $k_bT$ at room temperature.

FIG. 25 also depicts the magnetizations 365, 107 and 367 of the layers 364, 106', and 366, respectively. As can be seen in FIG. 5, the magnetizations 365 and 367 are not in-plane. This is because of the magnetic coupling between the layers 364/366 and 106'. As a result, the net moments 365 and 367 of the layers 364 and 366 have components in plane and perpendicular-to-plane. In particular, the magnetic moments 365 and 367 may be stable in a cone at a particular angle from the z-axis. The magnetic moment of the layer 36 is thus canted from the z-axis and, therefore, from the stagnation point.

Because the layer 360 is not at the stagnation point, spin transfer torque may act more rapidly and effectively in switching the magnetic state of the layer 360. Consequently, when used as a free layer in a magnetic junction, the layer 360 may have improved switching characteristics, lower write error rate, better thermal stability, and scalability.

Figure 26:
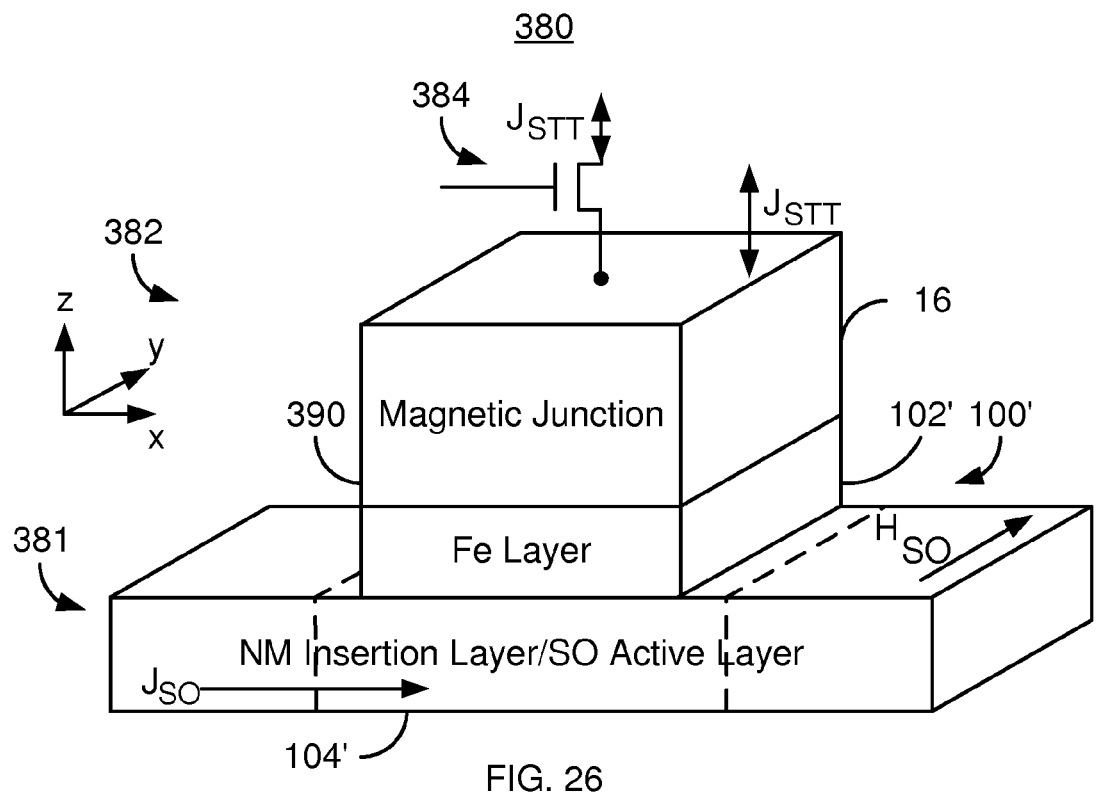
FIG. 26 depicts an exemplary embodiment of a magnetic memory that includes a magnetic substructure.

FIG. 26 depicts an exemplary embodiment of a portion of a magnetic memory 380 that utilizes spin-orbit interaction in switching in conjunction with a magnetic substructure 100, 100', 100'', and/or 100'''. For clarity, FIG. 26 is not to scale. In addition, portions of the magnetic memory 380 such as bit lines, word lines, row selectors and column selectors are not shown or not labeled as such. The magnetic memory 380 includes a magnetic storage cell 382. The magnetic storage cell 382 may be one of a number of magnetic storage cells ordered in an array. Each of the magnetic storage cells includes a magnetic junction 390 and may include a selection device 384. In some embodiments, multiple magnetic junctions 390 and/or multiple selection devices 384 may be used in a single cell. Also shown is a magnetic substructure 100' that includes a nonmagnetic insertion layer 104' such as W and a Fe layer 102'. The nonmagnetic insertion layer 104' may be localized to one cell 382 or may stretch across multiple cells 382 along the line 381. In still other embodiments, the nonmagnetic insertion layer 104' may be separate from the line 381. For example, the nonmagnetic insertion layer 104' may reside between the magnetic junction 390 and the line 381. In other embodiments, the nonmagnetic insertion layer 104' may be included as part of the storage cell 382. In still other embodiments, the nonmagnetic insertion layer 104' may be within an aperture in the line 381. The top and bottom of the nonmagnetic insertion layer 104' may extend above and below the top and bottom surface, respectively, of the line 104. Other configurations are also possible. Further, the Fe layer 102' may be desired to be part or all of the free layer or reference layer for the magnetic junction 390. For illustration purposes, in the following examples it is assumed that the Fe layer 102' is part or all of the free layer for the magnetic junction 390, however in other embodiments Fe layer 102' is a part or all of the reference layer for the magnetic junction 390.

The magnetic moment of the free layer within the magnetic junction 390 may be switched using the spin-orbit interaction effect, described below. In some embodiments, the free layer may be switched using a combination of effects. For example, the magnetic moment of the free layer may be switched using spin transfer torque as a primary effect that may be assisted by torque induced by the spin-orbit interaction. However, in other embodiments, the primary switching mechanism is torque induced by the spin-orbit interaction. In such embodiments, another effect including but not limited to spin transfer torque, may assist in switching and/or selecting the magnetic junction 390. In still other embodiments, the free layer magnetic moment is switched using only the spin-orbit interaction effect.

The nonmagnetic insertion layer 104' is a layer that has a strong spin-orbit interaction and that can be used in switching the magnetic moment of the free layer. Thus, the nonmagnetic insertion layer 104' may also be considered to be a spin-orbit (SO) active layer 104' for the purposes of the embodiment depicted in FIG. 26. For example, the SO active layer 104' may include the materials discussed above. Of these, W may be particularly desirable. The SO active layer 104' may be used in generating a spin-orbit field $H_{SO}$. More specifically, a current is driven in plane through the SO active layer 104'. This may be achieved by driving a current (e.g. $J_{SO}$) through the line 381. The current through the SO active layer 104' has an associated spin-orbit interaction that may result in the spin-orbit field $H_{SO}$. This spin-orbit field $H_{SO}$ is equivalent to the spin-orbit torque, $T_{SO}$, on the magnetic moment (not shown) of the Fe layer 102'. The spin-orbit torque on the free layer is given by $T_{SO}=\gamma[M \times H_{SO}]$, where M is the magnitude of the magnetic moment. This mutually correlated torque and field are thus interchangeably referred to herein as spin-orbit field and spin-orbit torque. This reflects the fact that the spin-orbit interaction is the origin of the spin-orbit torque and spin-orbit field. This terminology also differentiates this spin-orbit (SO) torque from the more conventional spin-transfer torque (STT). Spin-orbit torque occurs for a current driven in plane in the nonmagnetic insertion layer 104' if the SO active layer 104' has a high spin orbit interaction. For example, in the embodiment shown, the spin-orbit torque occurs for the current density $J_{SO}$. In contrast, spin transfer torque is due to a perpendicular-to-plane current flowing through magnetic junction 390, that injects spin polarized charge carriers into the magnetic junction. In the embodiment shown, the spin transfer torque is due to the current density $J_{STT}$. The current flowing through the line 381 and therefore through the SO active layer 104' can have very large current density (up to, or on the order of $10^8$ A/cm²). It is generally much larger than the current density which can flow through the barrier of the MTJ cell; the latter is generally limited by the size of the cell transistor and MTJ breakdown voltage and it typically does not exceed few MA/cm². Therefore, the spin-orbit torque $T_{SO}$ generated by $J_{SO}$ may be significantly larger than the maximum STT torque generated by the current flowing through the MTJ cell. As a result, the spin-orbit torque $T_{SO}$ may tilt the magnetization of the free layer considerably faster than conventional STT torque. The spin-orbit torque $T_{SO}$ may rapidly deflect the magnetic moment of the from its equilibrium state parallel to the easy axis (e.g. the z-axis or an axis in plane). In some embodiments, another mechanism such as spin transfer may be used to complete switching. In other embodiments, switching can be completed using spin-orbit torque. The spin-orbit field/spin-orbit torque generated may thus be used in switching the magnetic moment of the free layer. Note that although the spin orbit field is shown as in plane in FIG. 26, in other embodiments, the spin orbit field may be perpendicular to plane. In other embodiments, the spin-orbit field may have different direction.

In some embodiments, the SO interaction may include some combination of two effects: the spin Hall effect and the Rashba effect. In many SO active layers, the spin-orbit interaction includes both the spin Hall effect and the Rashba effect, but one of the two dominates. Other spin-orbit effects may also be employed. The spin Hall effect is generally considered to be a bulk effect. Materials that exhibit the spin Hall effect often include heavy metals or materials doped by heavy metals. For example, such materials can be selected from A and M doped by B. A includes Y, Zr, Nb, Mo, Tc, Ru, Rh, Pd, Cd, In, Sb, Te, Hf, Ta (including high-resistive amorphous β-Ta), W, Re, Os, Ir, Pt, Au, Hg, Tl, Pb, Bi, Po, At, and/or their combinations; M includes at least one of Al, Ti, V, Cr, Mn, Cu, Zn, Ag, Hf, Ta, W, Re, Pt, Au, Hg, Pb, Si, Ga, GaMn or GaAs, and B includes at least one of V, Cr, Mn, Fe, Co, Ni, P, S, Zn, Ga, Ge, As, Se, Y, Zr, Nb, Mo, Tc, Ru, Rh, Pd, Ag, Cd, In Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb. In some embodiments, the SO active layer 104' may include or consist of Ir doped Cu and/or Bi doped Cu. The doping is generally in the range of 0.1 through 10 atomic percent. In other embodiments, other materials may be used.

Another source of the spin-orbit field $H_{SO}$ in the SO active layer 104' can be related to the spin-orbit interaction at the interfaces. The magnitude of the spin-orbit field in this case is often related to the magnitude of the crystal field, which is often high at the interface. Due to the mismatch of the lattice parameters of the adjacent layers, the presence of heavy metals at the interface, and other effects, the spin-orbit interaction can be considerably large at some interfaces. A strong spin-orbit effect at the interface associated with the gradient of the crystal field in the perpendicular to the interface plane direction is often referred to as the Rashba effect. As used herein, however, the Rashba effect refers to a spin-orbit interaction at the interface regardless of its origin and direction. Note that in at least some embodiments, the interfaces for the SO active layer 104' should differ to get a sizable Rashba affect. The SO active layer 104' may include at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and/or their combinations. In other embodiments, the SO active layer 104' may include surface alloys of A/B, e.g. atoms of A residing on a (111) surface of a host material B such that on the top atomic layers are a mixture of A and B. A includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and B includes at least one of Si, Zn, Cu, Ag, Au, W, Zn, Cr, Pt, Pd. In many embodiments, A includes two or three different materials. In some embodiments, at least 0.1 to not more than three monolayers of A are deposited. In some such embodiments approximately ⅓ of a monolayer of A is deposited. In some embodiments, this can be one or more of substitutional Bi/Ag, substitutional Pb/Ag, substitutional Sb/Ag, substitutional Bi/Si, substitutional Ag/Pt, substitutional Pb/Ge, substitutional Bi/Cu, and a bilayer including a layer residing on a (111) surface of Au, Ag, Cu or Si. In other embodiments, the SO active layer 104' may include compounds like InGaAs, HgCdTe or bilayers $LaAlO_3/SrTiO_3$, $LaTiO_3/SrTiO_3$. In other embodiments, other materials may be used. For some embodiments, Rashba effect would result in the spin-orbit torque $T_{SO}$ and corresponding spin-orbit field $H_{SO}$ on the free layer.

As discussed above, in some embodiments, the magnetic substructure 100' is desired to have a high perpendicular magnetic anisotropy that is believed to be due to the interface between the layers 102' and 104'. Thus, in some embodiments, the nonmagnetic insertion layer/SO active layer 104' of FIG. 26 is desired to consist of at least one of W, I, Hf, Bi, Zn, Mo, Ag, Cd, Ox, and In. Such embodiments therefore benefit from both high perpendicular anisotropy and the torque provided by the spin-orbit interaction, which both originate at the interface between the layers 102' and 104'. In some other embodiments (not shown), the magnetic junction 390 may include another non-magnetic insertion layer, which includes at least one of W, I, Hf, Bi, Zn, Mo, Ag, Cd, Ox, and In. In some of these embodiments, the non-magnetic magnetic insertion layer, which consists of at least one of W, I, Hf, Bi, Zn, Mo, Ag, Cd, Ox, and In is located next to the layer 102'. The embodiments with both the non-magnetic insertion layer 104' and another non-magnetic insertion layer in the magnetic junction 390 may also benefit from the high perpendicular magnetic anisotropy and high torque provided by the current flowing in spin-orbit active layer 381. Some of them have additional benefit of having good growth matching or good deposition matching, for instance embodiments which have the same elements in both the non-magnetic insertion layer 104' and another non-magnetic insertion layer in the magnetic junction 390.

Thus, the magnetic memory 380 may use spin-orbit interaction and the spin-orbit field generated by the SO layer 104'/nonmagnetic insertion layer 104' in switching of the magnetic moment of the free layer. In some embodiments, the SO active layer 104' may rely one or both of the spin-Hall effect and the Rashba effect to generate the spin-orbit field $H_{SO}$. Consequently, as used herein, terms such as the "spin-orbit effect", "spin-orbit field and/or "spin-orbit interactions" may include spin-orbit coupling via the Rashba effect, the spin Hall effect, some combination of the two effects, and/or some other spin-orbit interaction or spin-orbit interaction-like effect. The spin-orbit fields can exert a torque on the magnetic moment of the data storage/free layer. This spin-orbit torque can be used in switching the magnetic moment of the free layer. In some embodiments, the spin-orbit field assists in switching the magnetic moment of the free layer. Another mechanism, such as spin transfer torque, is the primary switching mechanism. In other embodiments, the spin-orbit torque is the primary switching mechanism for the magnetic moment of the free layer. However, in some such embodiments, the spin-orbit torque may be assisted by another mechanism such as spin transfer torque. The assistance may be in switching the magnetic moment of the free layer and/or in selecting the magnetic junction to be switched.

Because the spin-orbit torque may be used in switching the magnetic moment of the free layer, performance of the memory 380 may be improved. As discussed above, the spin-orbit torque generated by the SO active layer 104' may reduce the switching time of the magnetic junction 382. The spin-orbit torque typically has a high efficiency $P_{SO}$ and is proportional to the current $J_{SO}$. Because this current density is in plane and does not flow through the spacer layer, this spin-orbit current may be increased without damage to the magnetic junction 110. As a result, the spin-orbit field and spin-orbit torque may be increased. Thus, the write time may be reduced and the write error rate improved. If layer 102' is a part or all of the reference layer for the magnetic junction 390, than the spin-orbit torque can be used to switch the reference layer from his equilibrium position to another position, or to temporarily deflect the reference layer from its equilibrium positions. This can be also used to improve write speed and probability and/or to improve read signal and reduce read error rates. Thus performance of the memory 100 may be improved.

Figure 27:
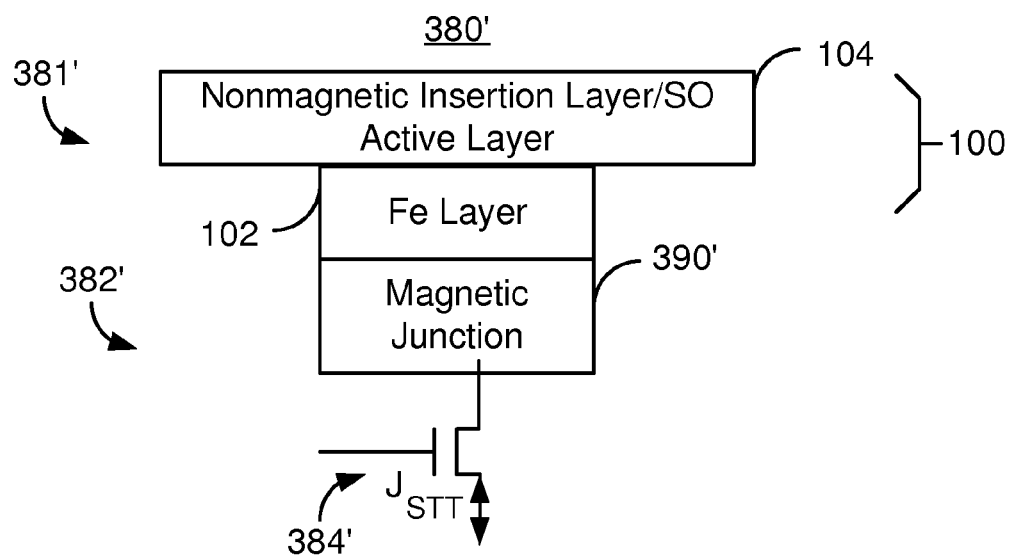
FIG. 27 depicts an exemplary embodiment of a magnetic memory that includes a magnetic substructure.

FIG. 27 depicts an exemplary embodiment of a portion of a magnetic memory 380' that utilizes spin-orbit interaction in switching in conjunction with a magnetic substructure 100, 100', 100'', and/or 100'''. For clarity, FIG. 27 is not to scale. In addition, portions of the magnetic memory 380' such as bit lines, word lines, row selectors and column selectors are not shown or not labeled as such. The magnetic memory 380' is analogous to the magnetic memory 380 and thus employs SO interaction based switching. The magnetic memory 380' thus includes a line 381', storage cell 382', selection device 384' and magnetic junction 390' that are analogous to the line 381, storage cell 382, selection device 384 and magnetic junction 390. However, in the embodiment shown, the magnetic junction 382' resides below the line 381' including the nonmagnetic insertion layer 104/SO active layer 104'. The memory 380' functions in analogous manner to the memory 380 and, therefore, enjoys similar benefits.

Figure 28:
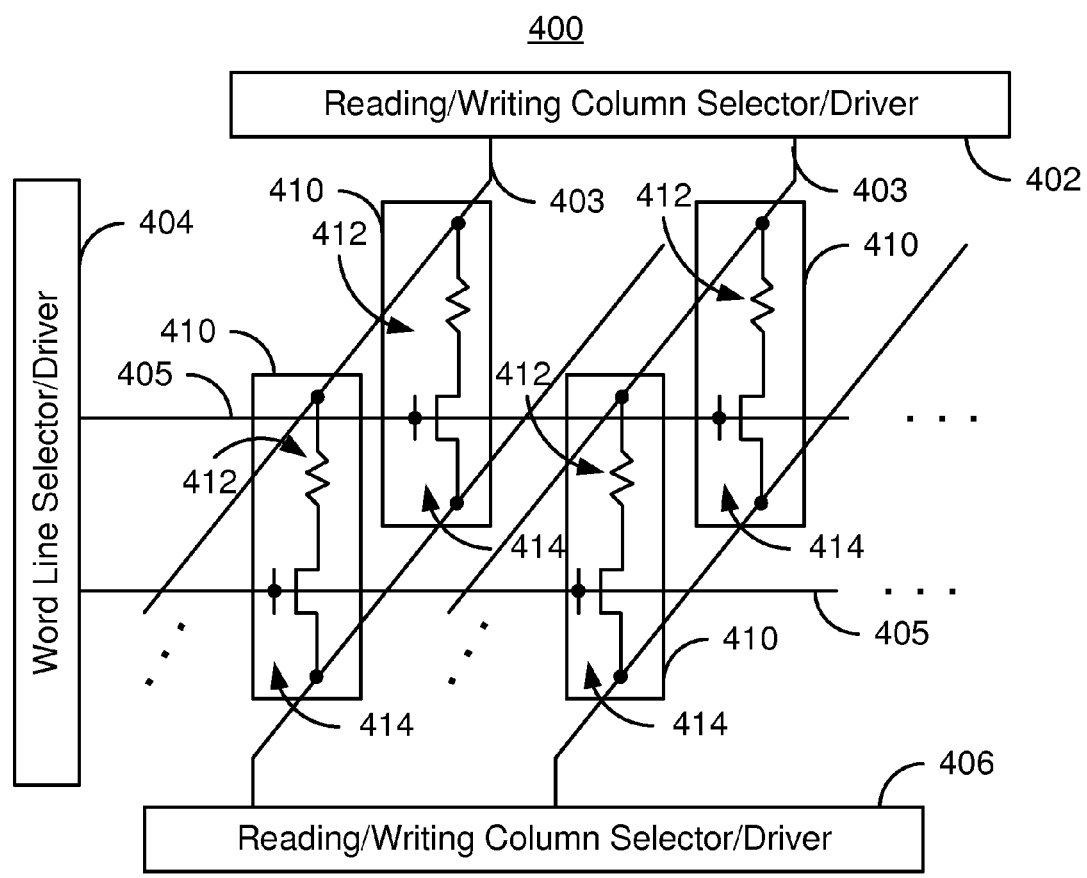
FIG. 28 depicts an exemplary embodiment of a memory utilizing magnetic junctions in the memory element(s) of the storage cell(s).

FIG. 28 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions disclosed herein utilizing magnetic substructures 100, 100', 100", and/or 100'". Although one magnetic junction 412 is shown per cell 410, in other embodiments, another number of magnetic junctions 412 may be provided per cell. As such, the magnetic memory 400 may enjoy the benefits described above.

Figure 29:
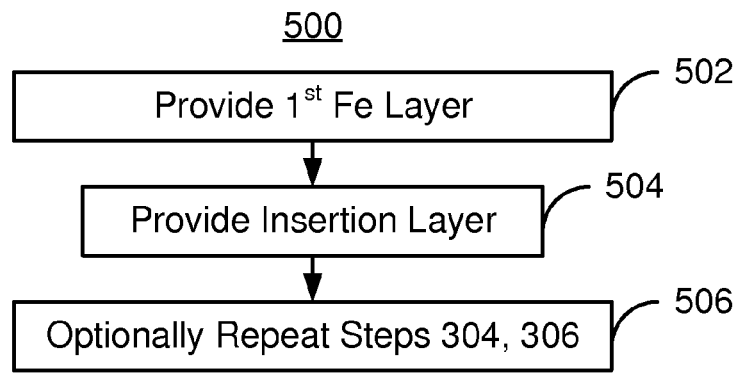
FIG. 29 an exemplary embodiment of a method for fabricating a magnetic junction including a magnetic substructure.

FIG. 29 depicts an exemplary embodiment of a method 500 for fabricating magnetic substructure. For simplicity, some steps may be omitted or combined. The method 500 is described in the context of the magnetic substructure 100. However, the method 500 may be used on other magnetic substructure such as the substructure 100', 100" and/or 100'". Further, the method 500 may be incorporated into fabrication of magnetic memories. Thus the method 500 may be used in manufacturing a STT-RAM or other magnetic memory.

The ferromagnetic layer 102 is provided, via step 502. Step 502 may include depositing the desired materials at the desired thickness of the ferromagnetic layer 102. The nonmagnetic insertion layer 104 is provided, via step 504. Step 504 may include depositing the desired nonmagnetic materials. Such material are W, I, Hf, Bi, Zn, Mo, Ag, Cd, Os, and/or In. In addition, the desired thickness of material may be deposited in step 504. Steps 304 and/or 306 are optionally a desired number of times, via step 306. Thus, one or more the magnetic substructures 100, 100', 100", 100'" having the desired number of ferromagnetic layers and insertion layers may be provided. Thus, the magnetic substructure 100, 100', 100", and/or 100'" is formed. Consequently, the benefits of the magnetic substructure may be achieved.

Figure 30:
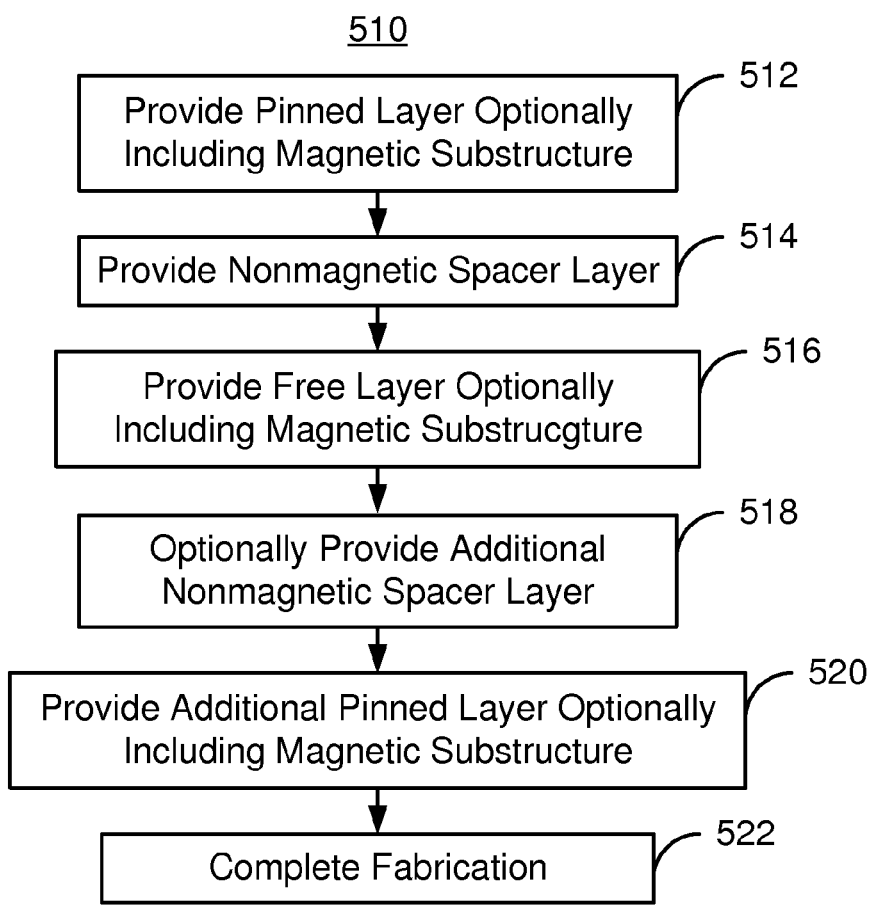
FIG. 30 an exemplary embodiment of a method for fabricating a magnetic junction including a magnetic substructure.

FIG. 30 depicts an exemplary embodiment of a method 510 for fabricating magnetic substructure. For simplicity, some steps may be omitted or combined. The method 510 is described in the context of the magnetic junction 150". However, the method 510 may be used on other magnetic junctions. Further, the method 510 may be incorporated into fabrication of magnetic memories. Thus the method 510 may be used in manufacturing a STT-RAM or other magnetic memory. The method 510 may commence after the seed layer(s) 152 and optional pinning layer 154 are provided.

The pinned layer 156" is provided, via step 512. Step 512 may include depositing the desired materials at the desired thickness of the pinned layer 156'. Further, step 512 may include providing a SAF. In some embodiments, the magnetic substructure 100, 100', 100", and/or 100'" may be provided as part of step 512. The nonmagnetic layer 158 is provided, via step 514. Step 514 may include depositing the desired nonmagnetic materials, including but not limited to crystalline MgO. In addition, the desired thickness of material may be deposited in step 514.

The free layer 160" optionally including the magnetic substructure 100, 100', 100", and/or 100'" is provided, via step 516. If a dual magnetic junction is to be formed, then an additional nonmagnetic spacer layer may optionally be provided, via step 518. An additional pinned layer may also optionally be provided, via step 520. In some embodiments, step 520 may include forming one or more of the substructures 100, 100', 100", and/or 100'" in the additional reference layer. Fabrication may then be completed, via step 522. For example, a capping layer may be provided. In other embodiments, an optional additional pinning layer may be provided. In some embodiments, in which the layers of the magnetic junction are deposited as a stack, then defined, step 522 may include defining the magnetic junction, performing anneals, or otherwise completing fabrication of the magnetic junction.

Further, if the magnetic junction is incorporated into a memory, such as an STT-RAM, step 522 may include providing contacts, bias structures, and other portions of the memory. Consequently, the benefits of the magnetic junction may be achieved.

A method and system for providing a magnetic substructure, a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
   a reference layer;
   a nonmagnetic spacer layer; and
   a free layer, the nonmagnetic spacer layer residing between the reference layer and the free layer, the magnetic junction being configured such that the free layer is switchable between a plurality of stable magnetic states when a write current is passed through the magnetic junction; and
   wherein a portion of the magnetic junction includes at least one magnetic substructure, the at least one magnetic substructure including at least one Fe layer and at least one nonmagnetic insertion layer, the at least one Fe layer sharing at least one interface with the at least one nonmagnetic insertion layer, each of the at least one nonmagnetic insertion layer consisting of at least one of W, I, Bi, Zn, Mo, Ag, Cd and In.

2. The magnetic junction of claim 1 wherein the portion of the magnetic junction including the at least one magnetic substructure is at least one of the free layer and the reference layer.

3. The magnetic junction of claim 2 wherein the at least one magnetic substructure includes a plurality of magnetic substructures.

4. The magnetic junction of claim 2 wherein the at least one Fe layer includes a first Fe layer and a second Fe, a nonmagnetic insertion layer of the at least one nonmagnetic insertion layer residing between the first Fe layer and the second Fe layer, the at least one interface including a first interface between the first Fe layer and the nonmagnetic insertion layer and a second interface between the second Fe layer and the nonmagnetic insertion layer, the first Fe layer being ferromagnetically coupled with the second Fe layer.

5. The magnetic junction of claim 2 wherein the at least one nonmagnetic insertion layer includes a first Fe layer and a second Fe, an Fe layer of the at least one Fe layer residing between the first nonmagnetic insertion layer and the second nonmagnetic insertion layer, the at least one interface including a first interface between the first nonmagnetic insertion layer and the Fe layer and a second interface between the second nonmagnetic insertion layer and the Fe layer.

6. The magnetic junction of claim 2 wherein the at least one of the reference layer and free layer includes a polarization enhancement layer, the at least one Fe layer being ferromagnetically coupled with the polarization enhancement layer.

7. The magnetic junction of claim 6 wherein the free layer include the at least one magnetic substructure and wherein the free layer includes an additional polarization enhancement layer, the at least one magnetic substructure being between the polarization enhancement layer and the additional polarization enhancement layer, the at least one Fe layer being ferromagnetically coupled with the additional polarization enhancement layer.

8. The magnetic junction of claim 7 wherein the additional polarization enhancement layer is thicker than the polarization enhancement layer.

9. The magnetic junction of claim 2 further comprising:
an additional reference layer; and
an additional nonmagnetic spacer layer, the additional nonmagnetic spacer layer being between the additional reference layer and the free layer, the free layer being between the additional nonmagnetic spacer layer and the nonmagnetic spacer layer.

10. The magnetic junction of claim 9 wherein the additional reference layer include at least one additional magnetic substructure, the at least one additional magnetic substructure including at least one additional Fe layer and at least one additional nonmagnetic insertion layer, the at least one additional Fe layer sharing at least one additional interface with the at least one additional nonmagnetic insertion layer, each of the at least one additional nonmagnetic insertion layer consisting of at least one of W, I, Hf, Bi, Zn, Mo, Ag, Cd, Os and In.

11. The magnetic junction of claim 2 further comprising:
a conductive capping layer.

12. The magnetic junction of claim 2 wherein the free layer includes the at least one magnetic substructure and wherein the free layer includes a plurality of magnetically soft layers and at least one hard magnetic layer, the at least one hard magnetic layer corresponding to the least one Fe layer, the at least one Fe layer being ferromagnetically coupled with the plurality of soft magnetic layers and having an out-of-plane demagnetization energy and a perpendicular magnetic anisotropy energy that exceeds the out-of-plane demagnetization energy.

13. The magnetic junction of claim 1 wherein the at least one magnetic substructure is adjacent to the free layer and is configured to exert a spin orbit torque on the free layer due to a current passing through the at least one magnetic substructure in a direction substantially perpendicular to a direction between the at least one magnetic substructure and the free layer of the magnetic junction, the free layer being configured to be switchable using at least the SO torque.

14. The magnetic junction of claim 1 wherein the at least one magnetic substructure adjoins the free layer and is configured to exert a spin orbit torque on the reference layer due to a current passing through the at least one magnetic substructure in a direction substantially perpendicular to a direction between the at least one magnetic substructure and the reference layer of the magnetic junction.

15. A magnetic memory comprising:
a plurality of magnetic junctions, each of the plurality of magnetic junctions including a free layer; and
at least one magnetic substructure adjacent to the plurality of magnetic junctions, each of the at least one magnetic substructure including at least one magnetic layer interleaved with at least one nonmagnetic insertion layer, each of the at least one nonmagnetic insertion layer consisting of at least one of W, I, Bi, Zn, Mo, Ag, Cd and In, the at least one magnetic substructure configured to exert a spin-orbit interaction (SO) torque on the free layer due to a current passing through the at least one magnetic substructure in a direction substantially perpendicular to a direction between the at least one magnetic substructure and the free layer of a magnetic junction of the plurality of magnetic junctions, the free layer being configured to be switchable using at least the SO torque.

16. A magnetic memory comprising:
a plurality of magnetic junctions, each of the plurality of magnetic junctions including a free layer, a reference layer and a nonmagnetic spacer layer between the free layer and the reference layer; and
at least one magnetic substructure adjacent to the plurality of magnetic junctions, each of the at least one magnetic substructure including at least one magnetic layer interleaved with at least one nonmagnetic insertion layer, each of the at least one nonmagnetic insertion layer consisting of at least one of W, I, Bi, Zn, Mo, Ag, Cd and In, the at least one magnetic substructure configured to exert a spin-orbit interaction (SO) torque on the reference layer due to a current passing through the at least one magnetic substructure in a direction substantially perpendicular to a direction between the at least one magnetic substructure and the reference layer of a magnetic junction of the plurality of magnetic junctions.

17. A magnetic memory comprising:
a plurality of magnetic storage cells, each of the plurality of magnetic storage cells including at least one magnetic junction, the at least one magnetic junction including a pinned layer, a nonmagnetic spacer layer, and a free layer, the nonmagnetic spacer layer residing between the pinned layer and the free layer, the magnetic junction being configured such that the free layer is switchable between a plurality of stable magnetic states when a write current is passed through the magnetic junction, a portion of the magnetic junction including at least one magnetic substructure, the at least one magnetic substructure including at least one Fe layer and at least one nonmagnetic insertion layer, the at least one Fe layer sharing at least one interface with the at least one nonmagnetic insertion layer, each of the at least one nonmagnetic insertion layer consisting of at least one of W, I, Bi, Zn, Mo, Ag, Cd and In.

18. The magnetic memory of claim 17 wherein the portion of the magnetic junction including the at least one magnetic substructure is at least one of the free layer and the reference layer.

19. The magnetic memory of claim 18 wherein the at least one magnetic substructure includes a plurality of magnetic substructures.

20. The magnetic memory of claim 18 wherein the at least one Fe layer includes a first Fe layer and a second Fe, a nonmagnetic insertion layer of the at least one nonmagnetic insertion layer residing between the first Fe layer and the second Fe layer, the at least one interface including a first interface between the first Fe layer and the nonmagnetic insertion layer and a second interface between the second Fe layer and the nonmagnetic insertion layer, the first Fe layer being ferromagnetically coupled with the second Fe layer.

21. The magnetic memory of claim 18 wherein the at least one nonmagnetic insertion layer includes a first Fe layer and a second Fe, an Fe layer of the at least one Fe layer residing between the first nonmagnetic insertion layer and the second nonmagnetic insertion layer, the at least one interface including a first interface between the first nonmagnetic insertion layer and the Fe layer and a second interface between the second nonmagnetic insertion layer and the Fe layer.

22. The magnetic memory of claim 18 wherein the at least one of the reference layer and free layer includes a polarization enhancement layer, the at least one Fe layer being ferromagnetically coupled with the polarization enhancement layer.

23. The magnetic memory of claim 22 wherein the free layer include the at least one magnetic substructure and wherein the free layer includes an additional polarization enhancement layer, the at least one magnetic substructure being between the polarization enhancement layer and the additional polarization enhancement layer, the at least one Fe layer being ferromagnetically coupled with the additional polarization enhancement layer.

24. The magnetic memory of claim 23 wherein the additional polarization enhancement layer is thicker than the polarization enhancement layer.

25. The magnetic memory of claim 18 wherein each of the at least one magnetic junction further includes:
an additional reference layer; and
an additional nonmagnetic spacer layer, the additional nonmagnetic spacer layer being between the additional reference layer and the free layer, the free layer being between the additional nonmagnetic spacer layer and the nonmagnetic spacer layer.

26. The magnetic memory of claim 25 wherein the additional reference layer include at least one additional magnetic substructure, the at least one additional magnetic substructure including at least one additional Fe layer and at least one additional nonmagnetic insertion layer, the at least one additional Fe layer sharing at least one additional interface with the at least one additional nonmagnetic insertion layer, each of the at least one additional nonmagnetic insertion layer consisting of at least one of W, I, Hf, Bi, Zn, Mo, Ag, Cd, Os and In.

27. The magnetic memory of claim 18 wherein the at least one magnetic junction further includes:
a conductive capping layer.

28. The magnetic memory of claim 18 wherein the free layer includes the at least one magnetic substructure and wherein the free layer includes a plurality of magnetically soft layers and at least one hard magnetic layer, the at least one hard magnetic layer corresponding to the least one Fe layer, the at least one Fe layer being ferromagnetically coupled with the plurality of soft magnetic layers and having an out-of-plane demagnetization energy and a perpendicular magnetic anisotropy energy that exceeds the out-of-plane demagnetization energy.

29. The magnetic memory of claim 17 wherein the at least one magnetic substructure is adjacent to the free layer and is configured to exert a spin orbit torque on the free layer due to a current passing through the at least one magnetic substructure in a direction substantially perpendicular to a direction between the at least one magnetic substructure and the free layer of the magnetic junction, the free layer being configured to be switchable using at least the SO torque.

30. The magnetic memory of claim 17 wherein the at least one magnetic substructure adjoins the free layer and is configured to exert a spin orbit torque on the reference layer due to a current passing through the at least one magnetic substructure in a direction substantially perpendicular to a direction between the at least one magnetic substructure and the reference layer of the magnetic junction.

31. A method for providing magnetic junction for use in a magnetic device comprising:
providing a reference layer;
providing a nonmagnetic spacer layer;
providing a free layer, the nonmagnetic spacer layer residing between the reference layer and the free layer, the magnetic junction being configured such that the free layer is switchable between a plurality of stable magnetic states when a write current is passed through the magnetic junction; and
providing at least one magnetic substructure, a portion of the magnetic junction includes the at least one magnetic substructure, the at least one magnetic substructure including at least one Fe layer and at least one nonmagnetic insertion layer, the at least one Fe layer sharing at least one interface with the at least one nonmagnetic insertion layer, each of the at least one nonmagnetic insertion layer consisting of at least one of W, I, Bi, Zn, Mo, Ag, Cd and In.

* * * * *